(12) United States Patent
Wang et al.

(10) Patent No.: US 12,150,276 B2
(45) Date of Patent: Nov. 19, 2024

(54) IMMERSED CABINET AND HEAT DISSIPATION SYSTEM THEREOF

(71) Applicant: Luxshare Thermal Technologies (HuiZhou) Co., Ltd, HuiZhou (CN)

(72) Inventors: PengFei Wang, Dongguan (CN); JianHua Chen, Dongguan (CN); Jun Zhao, Dongguan (CN); WenHe Li, Dongguan (CN); JiaRong Li, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 182 days.

(21) Appl. No.: 18/090,759

(22) Filed: Dec. 29, 2022

(65) Prior Publication Data

US 2024/0107709 A1 Mar. 28, 2024

(30) Foreign Application Priority Data

Sep. 23, 2022 (CN) .......................... 202211166843.X

(51) Int. Cl.
*H05K 7/20* (2006.01)
*H05K 5/06* (2006.01)

(52) U.S. Cl.
CPC ............ *H05K 7/203* (2013.01); *H05K 5/061* (2013.01); *H05K 7/20136* (2013.01); *H05K 7/20336* (2013.01); *H05K 7/20809* (2013.01)

(58) Field of Classification Search
CPC ............... H05K 7/20236; H05K 5/061; H05K 7/20136; H05K 7/203; H05K 7/20781; H05K 7/20272; H05K 7/20818; H05K 7/20327; H05K 7/20772; H05K 7/20318; H05K 7/20381; H05K 7/20836;
(Continued)

(56) References Cited

U.S. PATENT DOCUMENTS 9,622,379 B1 * 4/2017 Campbell .......... H05K 7/20318
11,116,113 B2 * 9/2021 Chiu .................... H05K 7/2039
(Continued)

FOREIGN PATENT DOCUMENTS

| CN | 209281327 U | 8/2019 |
| CN | 111031770 A | 4/2020 |

(Continued)

*Primary Examiner* — Michael A Matey
(74) *Attorney, Agent, or Firm* — Birch, Stewart, Kolasch & Birch, LLP

(57) ABSTRACT

Disclosed is an immersed cabinet, which includes a cabinet body and a heat sink assembly, wherein the heat sink assembly is in sealed connection with the cabinet body and configured to seal an opening of the cabinet body. The cabinet body accommodates a plurality of devices to be cooled, and cooling liquid is put in the cabinet body and used for immersing the plurality of devices to be cooled. The cooling liquid absorbs heat generated by the plurality of devices to be cooled and then is vaporized. The heat sink assembly exchanges heat with the vaporized cooling liquid, so that the vaporized cooling liquid condenses and flows back to the cabinet body for circulation, and the heat sink assembly dissipates the heat into the atmosphere. Therefore, the heat dissipation structure design of the immersed cabinet is effectively simplified.

19 Claims, 25 Drawing Sheets

(58) Field of Classification Search
CPC .......... H05K 7/20263; H05K 7/20809; H05K 7/208; H05K 7/20; H05K 7/20281; H05K 7/20336; H05K 7/2039; H05K 7/20636; H05K 7/20736; H05K 1/0203; H05K 7/20154; H05K 7/20763; F28D 2021/0028; F28D 1/0206; F28D 1/0213; F28D 2021/0029; F28D 1/024; F28D 15/00; F28D 1/0426
See application file for complete search history.

(56) References Cited

U.S. PATENT DOCUMENTS

| | | | | |
|---|---|---|---|---|
| 2015/0060009 | A1* | 3/2015 | Shelnutt | H05K 7/20809 165/11.1 |
| 2015/0109735 | A1* | 4/2015 | Campbell | H05K 7/2079 361/700 |
| 2017/0290198 | A1* | 10/2017 | Shepard | H05K 7/20881 |
| 2018/0027695 | A1* | 1/2018 | Wakino | H05K 7/20772 361/699 |
| 2018/0098464 | A1* | 4/2018 | Ishinabe | H05K 7/20736 |
| 2018/0199465 | A1* | 7/2018 | Metzler | H05K 7/20936 |
| 2019/0008077 | A1* | 1/2019 | Ishinabe | H05K 7/20736 |
| 2019/0200482 | A1* | 6/2019 | Boyd | H05K 7/20236 |
| 2019/0255961 | A1* | 8/2019 | Heyne | B60L 53/302 |
| 2020/0337176 | A1* | 10/2020 | Aoki | H05K 7/20327 |
| 2020/0393206 | A1 | 12/2020 | Liu et al. | |
| 2021/0410320 | A1* | 12/2021 | Yang | H05K 7/20327 |
| 2022/0361381 | A1* | 11/2022 | Sweeney | H05K 7/20781 |
| 2024/0172393 | A1* | 5/2024 | Ahuja | H05K 7/20772 |

FOREIGN PATENT DOCUMENTS

| | | |
|---|---|---|
| TW | 202112214 A | 3/2021 |
| TW | M631175 U | 8/2022 |
| TW | M631632 U | 9/2022 |
| TW | M631695 U | 9/2022 |

* cited by examiner

IMMERSED CABINET AND HEAT DISSIPATION SYSTEM THEREOF

CROSS REFERENCE TO RELATED PRESENT DISCLOSURE

This application claims the priority benefit of Chinese Patent Application Serial Number 202211166843.X, filed on Sep. 23, 2022, the full disclosure of which is incorporated herein by reference.

BACKGROUND

Technical Field

The present disclosure relates to the technical field of heat dissipation equipment, and in particular, to an immersed cabinet and a heat dissipation system thereof.

Related Art

With the rapid development of electronic technology, the problem of heat dissipation of the electronic equipment has become increasingly prominent. In the field of data centers, the electronic equipment has gradually applied immersion liquid cooling technology for heat dissipation. When the single-phase immersion liquid cooling technology is applied, it is necessary to immerse the electronic equipment in a cooling container filled with cooling liquid, wherein the cooling liquid takes away the heat generated by the electronic equipment, it is necessary to set up a cooling distribution unit (CDU) for the liquid cooling cycle outside the cooling container, and the cooling distribution unit includes a cooling plate/heat exchanger, a receiver, a water pump, a controller, a sensor and other parts. Therefore, the existing immersed cabinet using single-phase immersion liquid cooling technology has the problems of a complex heat dissipation structure, high maintenance difficulty, and large power loss.

Therefore, how to provide a scheme that solves the above-mentioned technical problems is the problem that those skilled in the art need to solve at present.

SUMMARY

Embodiments of the present disclosure provide an immersed cabinet and a heat dissipation system thereof, which can solve the problems of a complex heat dissipation structure, high maintenance difficulty and large power loss in the existing immersed cabinet that uses the single-phase immersion liquid cooling technology because it needs to install the cooling distribution unit including multiple parts outside the cooling container.

In order to solve above-mentioned technical problems, the present disclosure is implemented as follows.

The present disclosure provides an immersed cabinet, which includes a cabinet body and a heat sink assembly, wherein the heat sink assembly is in sealed connection with the cabinet body and configured to seal an opening of the cabinet body. The cabinet body accommodates a plurality of devices to be cooled, and cooling liquid is put in the cabinet body and used for immersing the plurality of devices to be cooled. The cooling liquid absorbs heat generated by the plurality of devices to be cooled and then is vaporized. The heat sink assembly exchanges heat with the vaporized cooling liquid, so that the vaporized cooling liquid condenses and flows back to the cabinet body for circulation, and the heat sink assembly dissipates the heat into the atmosphere.

The present disclosure provides a heat dissipation system of an immersed cabinet, which includes a case body and a fan array. The case body is provided with a partition plate to form a cable passage on the top of the case body. A front side wall and a rear side wall of the case body are provided with a plurality of ventilation holes, the case body accommodates a plurality of immersed cabinets of the present disclosure disposed side by side, and a heat dissipation direction of the heat sink assembly of the immersed cabinet of the present disclosure is parallel to a ventilation direction of the case body. The fan array is disposed between the partition plate and a bottom surface of the case body, and between the front side wall and the plurality of immersed cabinets of the present disclosure disposed side by side. The fan array blows air toward the plurality of immersed cabinets of the present disclosure disposed side by side.

In the embodiments of the present disclosure, the immersed cabinet adopts the design of the heat sink assembly sealedly connected with the cabinet body, instead of the cooling distribution unit that needs to be set outside the cooling container for the existing immersed cabinet using single-phase immersion liquid cooling heat dissipation technology, which effectively simplifies the heat dissipation structure design of the immersed cabinet, and reduces loss. In addition, through the setting of the fan array, the heat dissipation system of the immersed cabinet accelerates the air convection inside the case body, accelerates the heat dissipation of the heat sink assembly of the immersed cabinet, and improves the heat dissipation performance.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

The following embodiments describe the features and advantages of the present disclosure in detail, but do not limit the scope of the present disclosure in any point of view. According to the description, claims, and drawings, a person ordinarily skilled in the art can easily understand the technical content of the present disclosure and implement it accordingly.

The embodiments of the present disclosure will be described below in conjunction with the relevant drawings. In the figures, the same reference numbers refer to the same or similar components or method flows.

It must be understood that the words "including", "comprising" and the like used in this specification are used to indicate the existence of specific technical features, values, method steps, work processes, elements and/or components. However, it does not exclude that more technical features, values, method steps, work processes, elements, components, or any combination of the above can be added.

It must be understood that when an element is described as being "connected" or "coupled" to another element, it may be directly connected or coupled to another element, and intermediate elements therebetween may be present. In contrast, when an element is described as being "directly connected" or "directly coupled" to another element, there is no intervening element therebetween.

Figure 1:
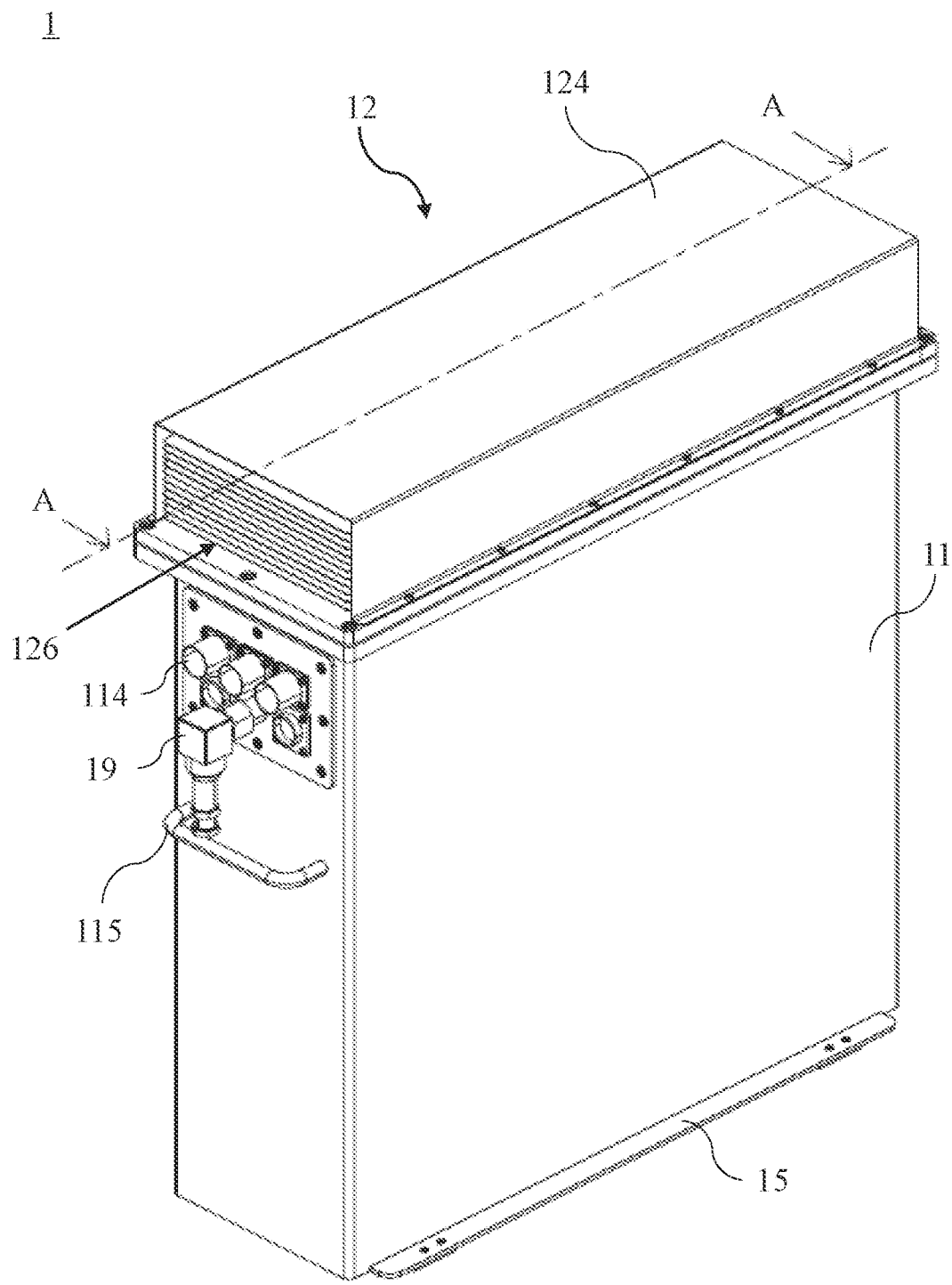
FIG. 1 is a schematic perspective view of an immersed cabinet according to an embodiment of the present disclosure.
Figure 2:
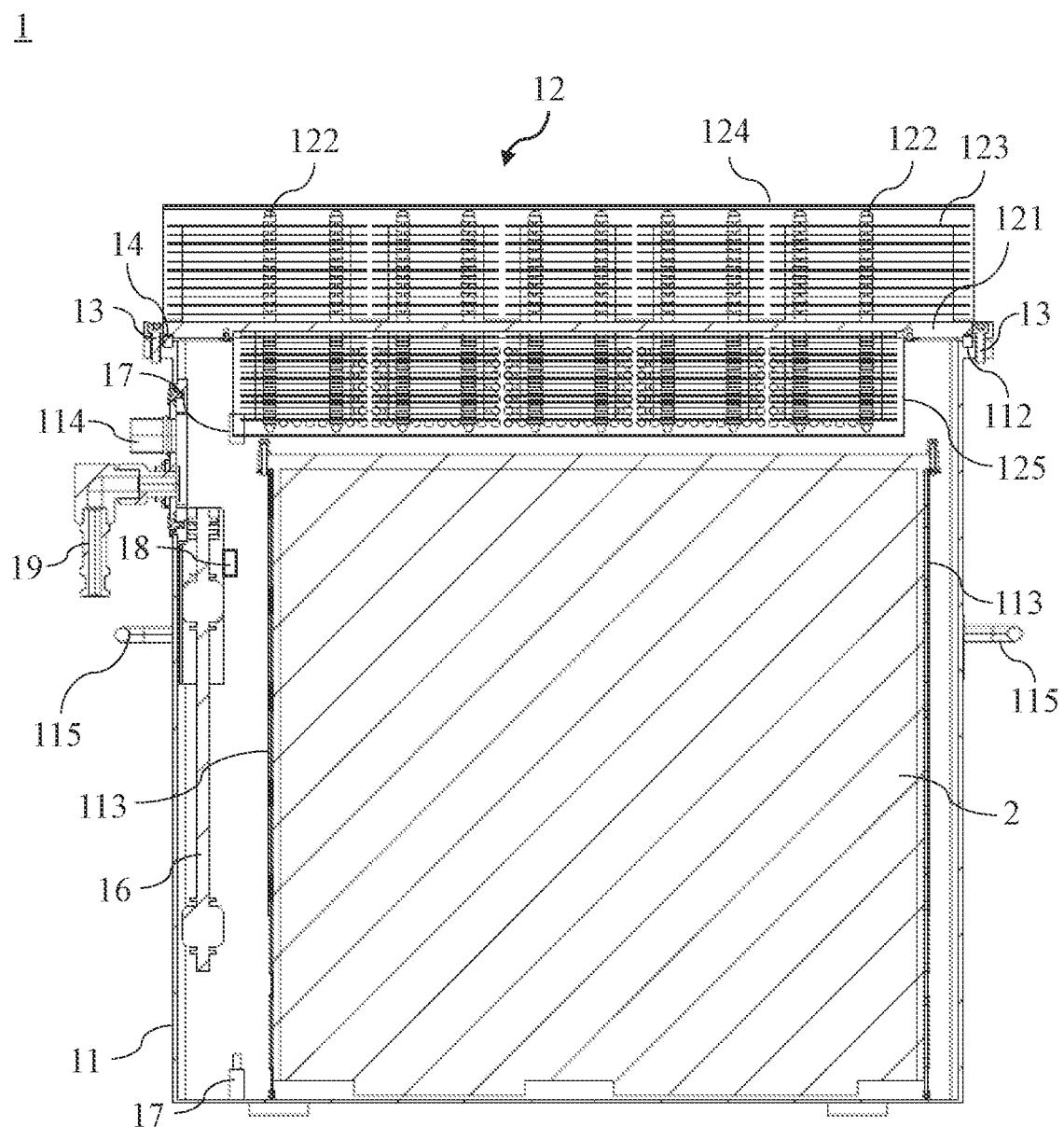
FIG. 2 is a schematic cross-sectional view of the immersed cabinet taken along line A-A of FIG. 1.
Figure 3:
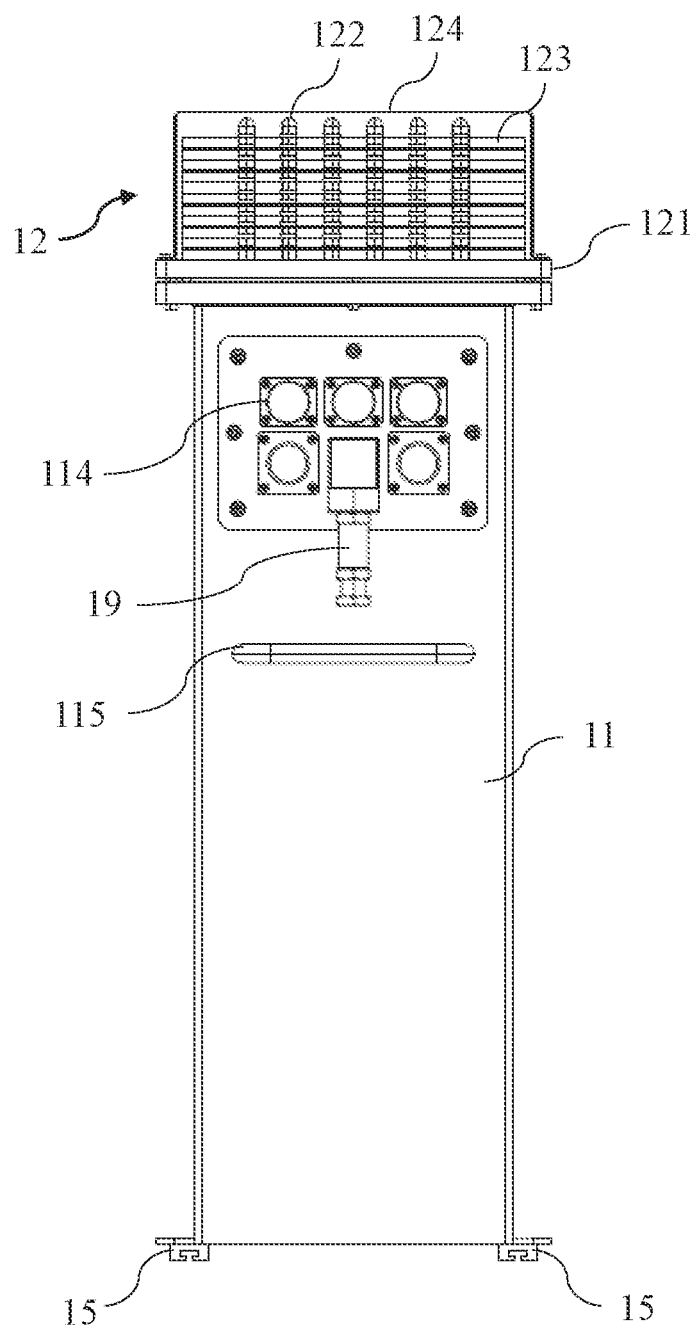
FIG. 3 is a schematic view of the immersed cabinet of FIG. 1.
Figure 4:
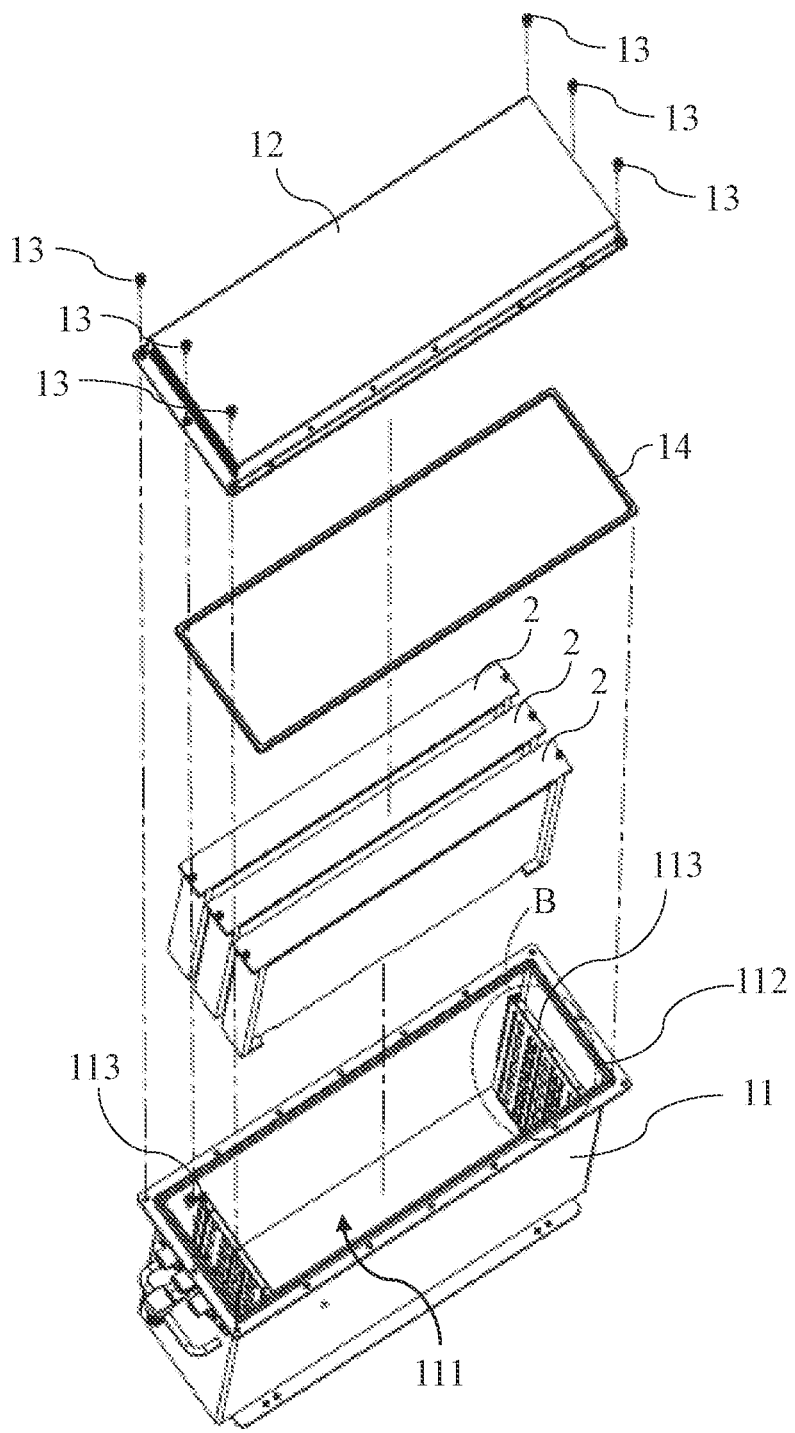
FIG. 4 is an exploded view of an embodiment of the immersed cabinet of FIG. 1.

Please refer to FIG. 1 to FIG. 4, wherein FIG. 1 is a schematic perspective view of an immersed cabinet according to an embodiment of the present disclosure, FIG. 2 is a schematic cross-sectional view of the immersed cabinet taken along line A-A of FIG. 1, FIG. 3 is a schematic view of the immersed cabinet of FIG. 1, and FIG. 4 is an exploded view of an embodiment of the immersed cabinet of FIG. 1. As shown in FIG. 1 to FIG. 4, an immersed cabinet 1 comprises a cabinet body 11 and a heat sink assembly 12. The heat sink assembly 12 is in sealed connection with the cabinet body 11, and is configured to seal the opening 111 of the cabinet body 11. The cabinet body 11 accommodates a plurality of devices to be cooled 2, and cooling liquid (not shown) is put in the cabinet body 11 and used for immersing the plurality of devices to be cooled 2. The cooling liquid absorbs the heat generated by the plurality of devices to be cooled 2 and then is vaporized. The heat sink assembly 12 exchanges heat with the vaporized cooling liquid, so that the vaporized cooling liquid condenses and flows back to the cabinet body 11 for circulation, and the heat sink assembly 12 dissipates the heat into the atmosphere. In this embodiment, the cabinet body 11 may be formed by sheet metal bending and welding process to reduce cost and simplify design; the device to be cooled 2 may be but not limited to a blade server, and the number of devices to be cooled 2 may be but not limited to three; the cooling liquid may be but not limited to fluorinated liquid, the cooling liquid may immerse at least part of the devices to be cooled 2 (that is, the devices to be cooled 2 are not completely immersed in the cooling liquid), but this embodiment is not intended to limit the present disclosure, and can be adjusted according to actual needs.

In one embodiment, the heat sink assembly 12 may be fastened to the cabinet body 11 by screws 13. Through the design of screw locking, it is convenient to install and disassemble the heat sink assembly 12.

In one embodiment, the cabinet body 11 may be provided with an annular slot 112 at a sealing connection between the cabinet body 11 and the heat sink assembly 12. The immersed cabinet 1 may further comprise a sealing ring 14, and the sealing ring 14 is disposed in the annular slot 112. Through the setting of the sealing ring 14, the volatilization of the cooling liquid is prevented.

Figure 5:
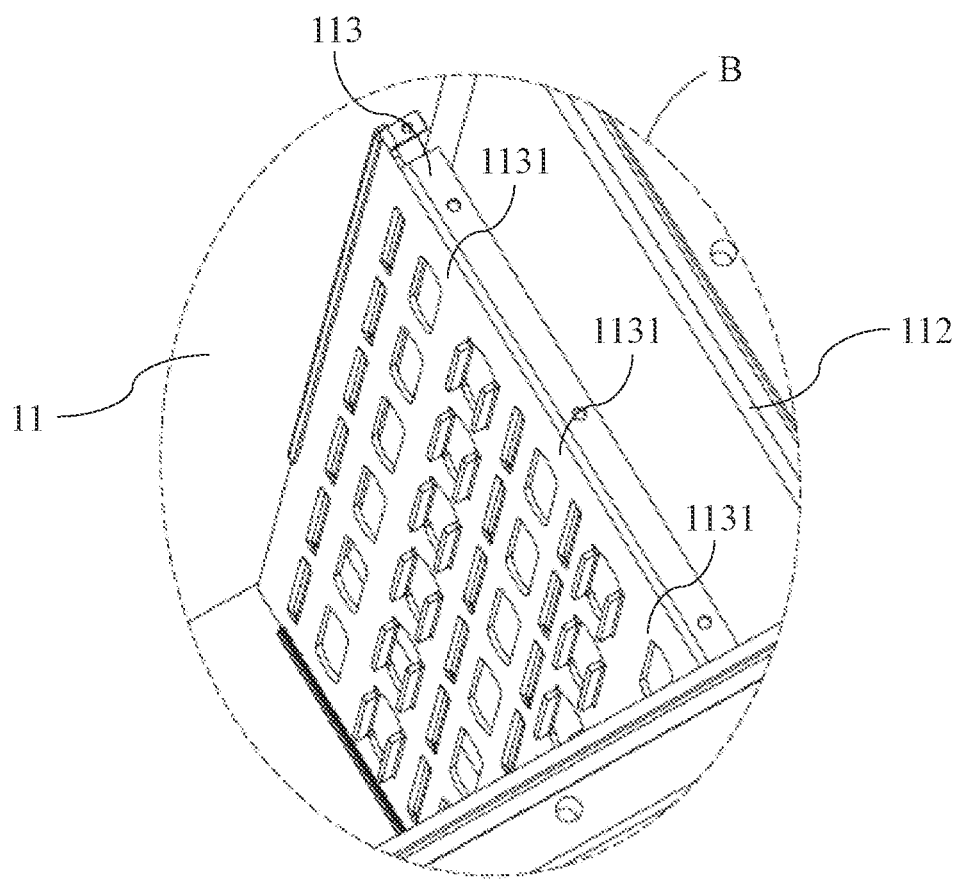
FIG. 5 is an enlarged schematic view of area B in FIG. 4.

Please refer to FIG. 4 and FIG. 5, and FIG. 5 is an enlarged schematic view of area B in FIG. 4. As shown in FIG. 4 and FIG. 5, mounting brackets 113 may be fixedly installed in the cabinet body 11 and are symmetrically distributed; each mounting bracket 113 is provided with a plurality of slideways 1131, and two ends of each device to be cooled 2 are slidably installed in one slideway 1131 of the symmetrically distributed mounting brackets 113. The arrangement of the symmetrically distributed mounting brackets 113 facilitates the insertion and extraction of the device to be cooled 2.

Please refer to FIG. 1 to FIG. 3, an outer wall of the cabinet body 11 is provided with a plurality of aviation plugs 114, and the plurality of aviation plugs 114 are configured to connect with cables in the cabinet body 11 to realize transmission of internal and external signals of the immersed cabinet 1. It should be noted that, for the purpose of simplicity, the drawing of the cables between the immersed cabinet 1 and the device to be cooled 2 is omitted.

Figure 6:
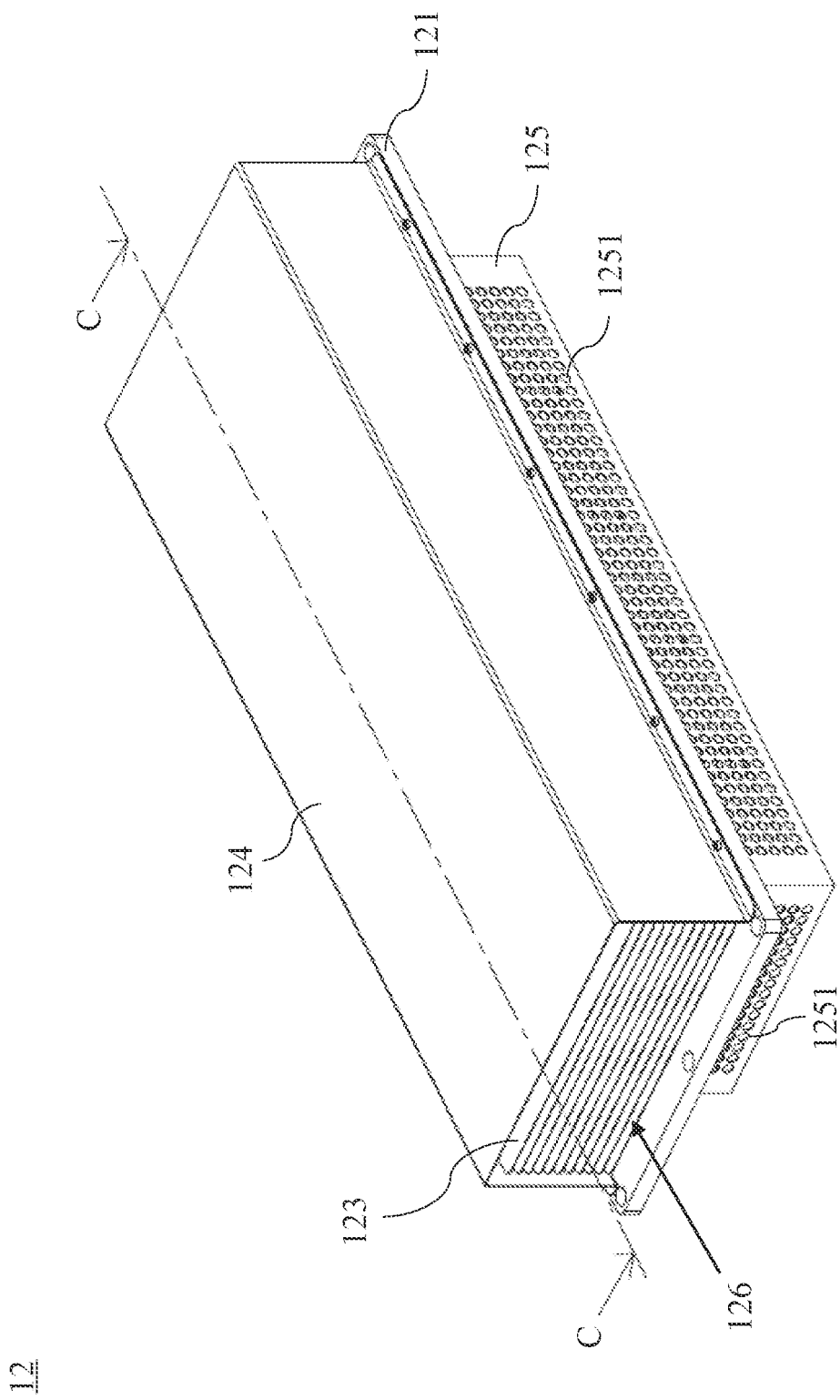
FIG. 6 is a schematic perspective view of an embodiment of the heat sink assembly of FIG. 1.
Figure 7:
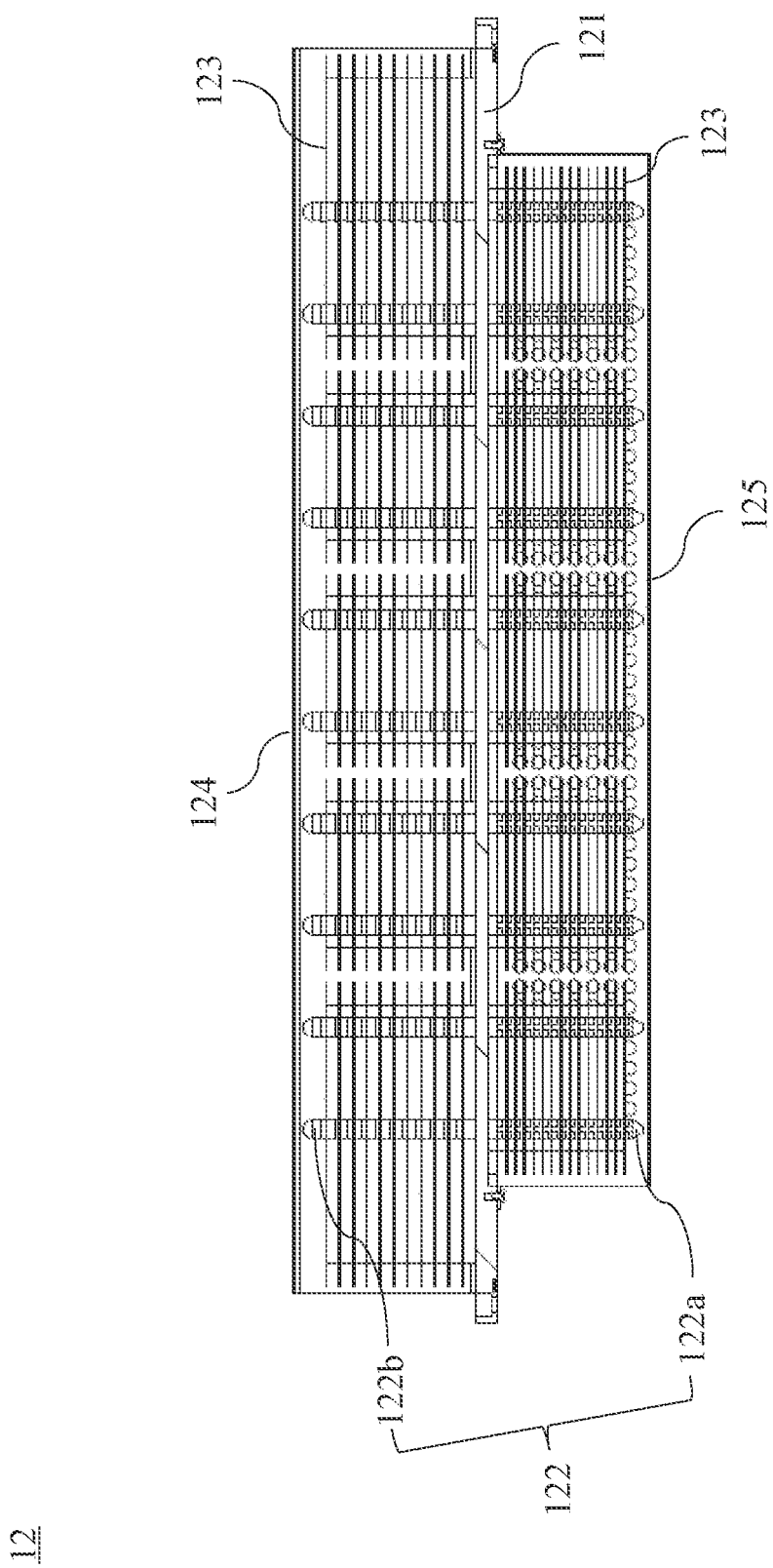
FIG. 7 is a schematic cross-sectional view of the cooling assembly taken along line C-C of FIG. 6.
Figure 8:
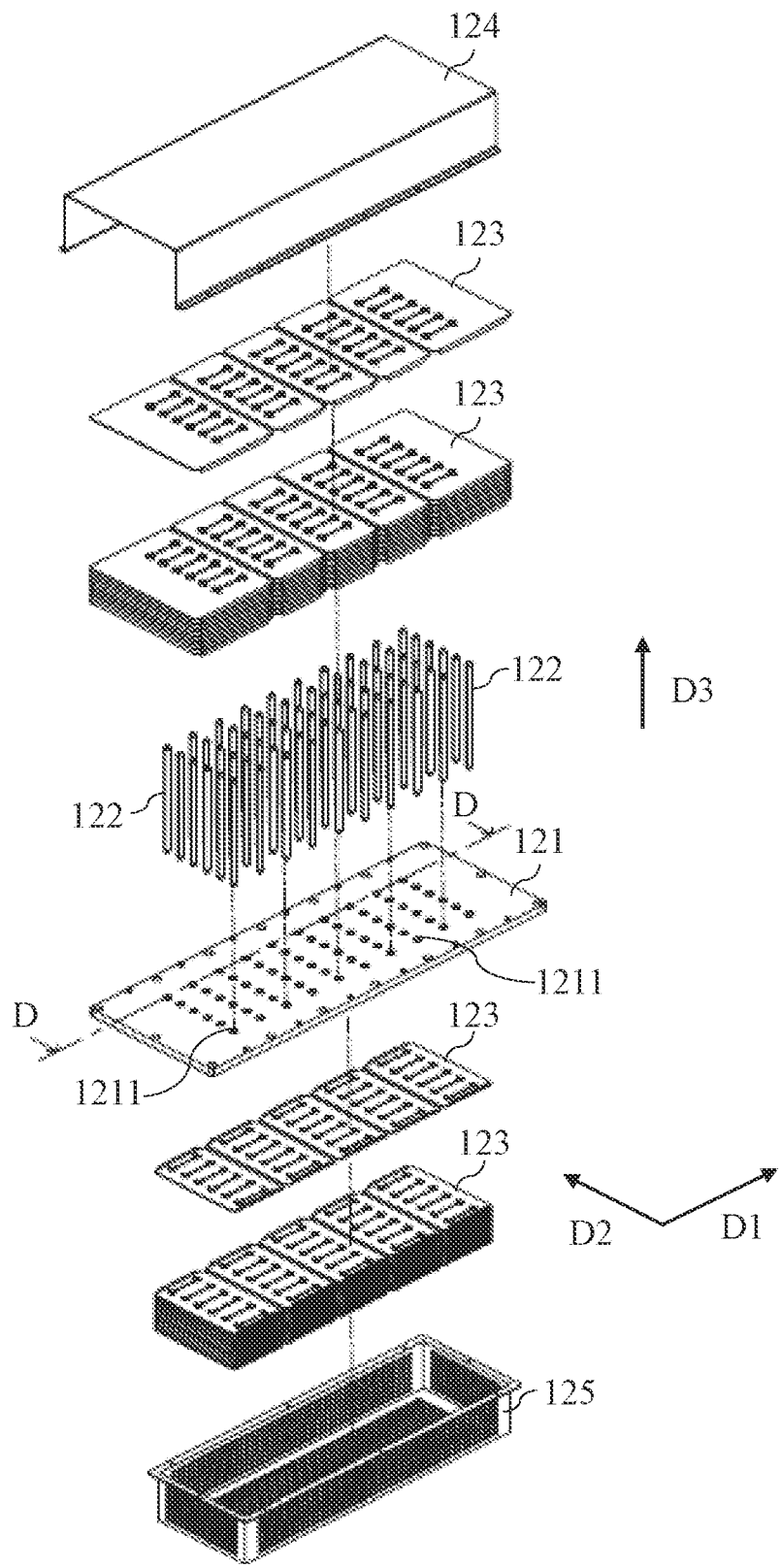
FIG. 8 is an exploded view of an embodiment of the heat sink assembly of FIG. 6.

Please refer to FIG. 6 to FIG. 8, wherein FIG. 6 is a schematic perspective view of an embodiment of the heat sink assembly of FIG. 1, FIG. 7 is a schematic cross-sectional view of the cooling assembly taken along line C-C of FIG. 6, and FIG. 8 is an exploded view of an embodiment of the heat sink assembly of FIG. 6. As shown in FIG. 6 to FIG. 8, the heat sink assembly 12 may comprise a first substrate 121, a plurality of heat pipes 122 and a plurality of cooling fins 123, the first substrate 121 is fastened to the cabinet body 11 and provided with a plurality of through holes 1211, the plurality of heat pipes 122 are tightly connected to the first substrate 121 through the plurality of through holes 1211, and each heat pipe 122 is divided into a first section 122a facing the cabinet body 11 and a second section 122b away from the cabinet body 11 by being tightly connected to the first substrate 121. A part of the plurality of cooling fins 123 are tightly connected to the first sections 122a of the plurality of heat pipes 122 by means of interference fit, and are configured to exchange heat with the vaporized cooling liquid, and conduct the heat to the plurality of heat pipes 122. The other part of the plurality of cooling fins 123 are tightly connected to the second sections 122b of the plurality of heat pipes 122 by means of interference fit, and are configured to dissipate heat from the plurality of heat pipes 122 to the atmosphere.

Specifically, a plurality of heat pipes 122 may be tightly connected to the first substrate 121 by welding or crimping. Since the first substrate 121 is tightly connected to the middle portion of the heat pipe 122, the first substrate 121 divides the heat pipe 122 into the first section 122a and the second section 122b. When the heat sink assembly 12 is in sealed connection with the cabinet body 11, the first sections 122a of the plurality of heat pipes 122 face the cabinet body 11 (that is, the first sections 122a of the plurality of heat pipes 122 are arranged in the cabinet body 11, close to the device to be cooled 2 which generate heat as shown in FIG. 2), and the second sections 122b of the plurality of heat pipes 122 are far away from the cabinet body 11 (that is, the second sections 122b of the plurality of heat pipes 122 are exposed to the atmosphere as shown in FIG. 2). The plurality of cooling fins 123 tightly connected to the first sections 122a of the plurality of heat pipes 122 are configured to exchange heat with the vaporized cooling liquid, and conduct the heat to the plurality of heat pipes 122. When the first section 122a of the heat pipe 122 is heated to a certain extent, the liquid working medium in the heat pipe 122 is vaporized, and flows to the second section 122b under the action of the pressure difference inside heat pipe 122 to take away the heat. Next, the vaporized working medium is condensed and liquefied in the second section 122b with lower temperature, the heat is released to the atmosphere through the plurality of cooling fins 123 tightly connected to the second section 122b of the heat pipe 122, and the liquefied working medium returns to the first section 122a under the capillary force of the tube core. Thus, such a cycle realizes heat transfer from the first section 122a of the heat pipe 122 to the second section 122b of the heat pipe 122, so as to achieve the purpose of dissipating heat from the device to be cooled 2.

Figure 9:
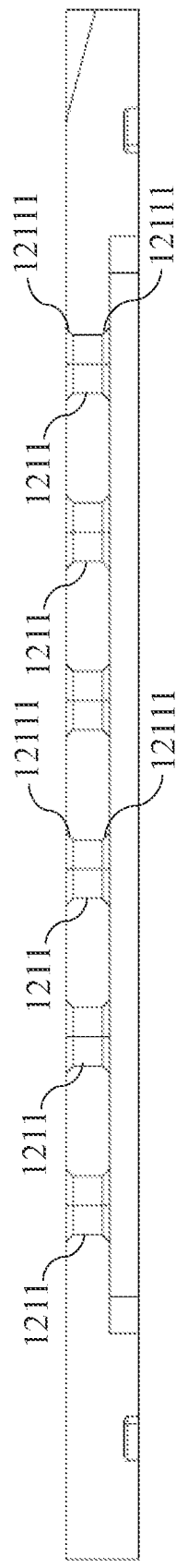
FIG. 9 is a schematic cross-sectional view of the first substrate taken along line D-D of FIG. 8.

In one embodiment, when the plurality of heat pipes 122 may be tightly connected to the first substrate 121 by welding, an edge of each through hole 1211 of the first substrate 121 may be provided with a reverse taper angle 12111, as shown in FIG. 9, which is a schematic cross-sectional view of the first substrate taken along line D-D of FIG. 8, wherein for the purpose of simplicity, only a part of the through holes 1211 are drawn as representatives. Specifically, the first substrate 121 may be formed by numerical control machining, and the edges of two sides of the through hole 1211 fitted with the heat pipe 122 may be provided with reverse taper angles 12111, which is convenient for evenly applying solder to ensure the welding quality between the heat pipe 122 and the first substrate 121, and to ensure the sealing reliability.

Figure 10:
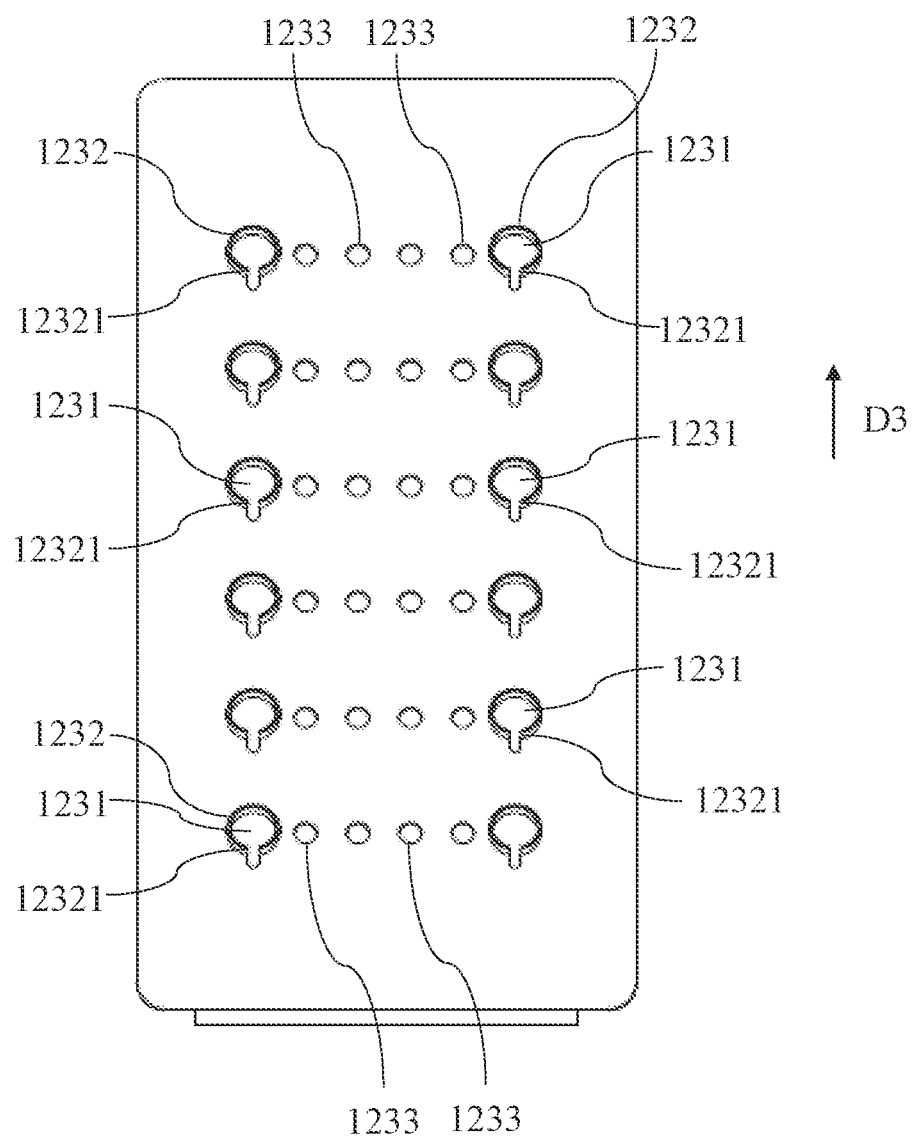
FIG. 10 is a schematic diagram of the heat sink of FIG. 8.

In one embodiment, when each cooling fin 123 may be tightly connected to the plurality of heat pipes 122 by welding, each cooling fin 123 may be provided with a plurality of openings 1231 tightly connected to the plurality of heat pipes 122, and a hole wall 1232 extending along an extending direction D3 of the plurality of heat pipes 122 around each opening 1231 may be provided with a guide groove 12321, as shown in FIG. 10, which is a schematic diagram of the heat sink of FIG. 8, to facilitate the flow of solder along the guide groove 12321 to evenly distribute around the opening 1231 and improve the welding quality. The opening 1231 and the hole wall 1232 extending around it can be formed by stamping. In order to reduce the difficulty of sheet metal forming of the cooling fin 123 and improve the processing accuracy of the openings 1231 and the matching precision of the cooling fin 123 and the heat pipe 122, the cooling fin 123 may be designed with a thin thickness, such as 0.5 mm, and a small area (that is, the plurality of cooling fins 123 may be arranged in multiple rows along the first direction D1 at intervals, and the cooling fins 123 for each row may be stacked along the second direction D2 and arranged at intervals from each other, wherein the second direction D2 and the first direction D1 are perpendicular to each other). In addition, each cooling fin 123 may further be provided with a plurality of heat dissipation holes 1233.

Please refer to FIG. 6 to FIG. 8, the heat sink assembly 12 may further comprise a first protective cover 124 and a second protective cover 125. The first protective cover 124 covers the plurality of cooling fins 123 tightly connected to the second sections 122b of the plurality of heat pipes 122, and is fixedly connected to the first substrate 121 to form a heat dissipation air channel 126 with two open ends. The second protective cover 125 covers the plurality of cooling fins 123 tightly connected to the first sections 122a of the plurality of heat pipes 122, and is fixedly connected to the first substrate 121, and is provided with a plurality of perforations 1251. Specifically, the first protective cover 124 may be an inverted U-shaped protective cover, and the two ends of the inverted U-shaped protective cover are fixedly connected to the first substrate 121 to form the heat dissipation air channel 126 arranged along the first direction D1, so that the first protective cover 124 can not only protect the second section 122b of the heat pipe 122 and the connected cooling fin 123, but also play a role of guiding the wind, which is beneficial to speed up the heat dissipation and avoids the operator from being burned. The second protective cover 125 may cover the first substrate 121 to protect the first section 122a of the heat pipe 122 and the cooling fin 123 connected thereto. Through the setting of the plurality of perforations 1251, the vaporized cooling liquid may exchange heat with the first section 122a of the heat pipe 122 and the cooling fins 123 connected thereto.

Figure 11:
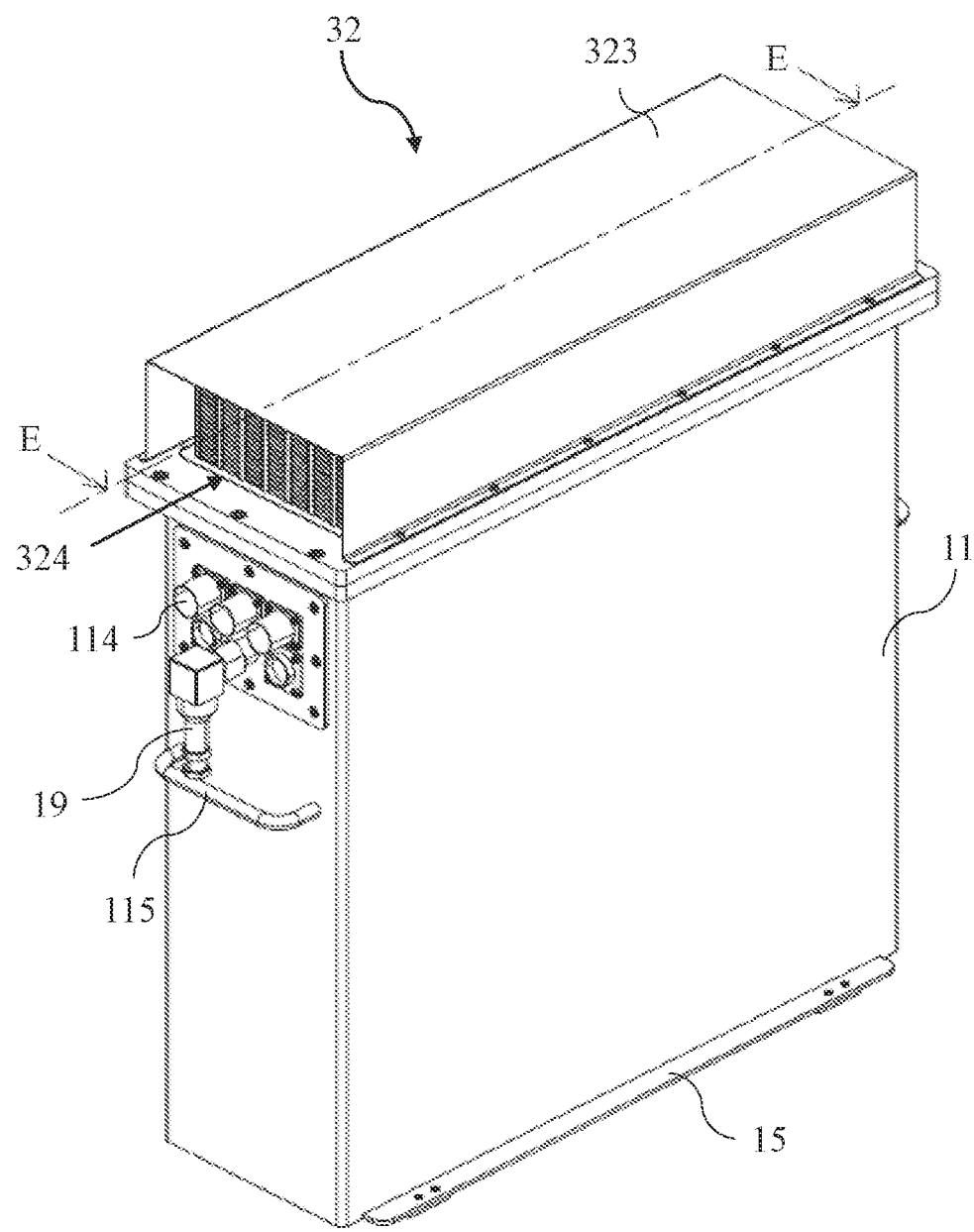
FIG. 11 is a schematic perspective view of an immersed cabinet according to another embodiment of the present disclosure.
Figure 12:
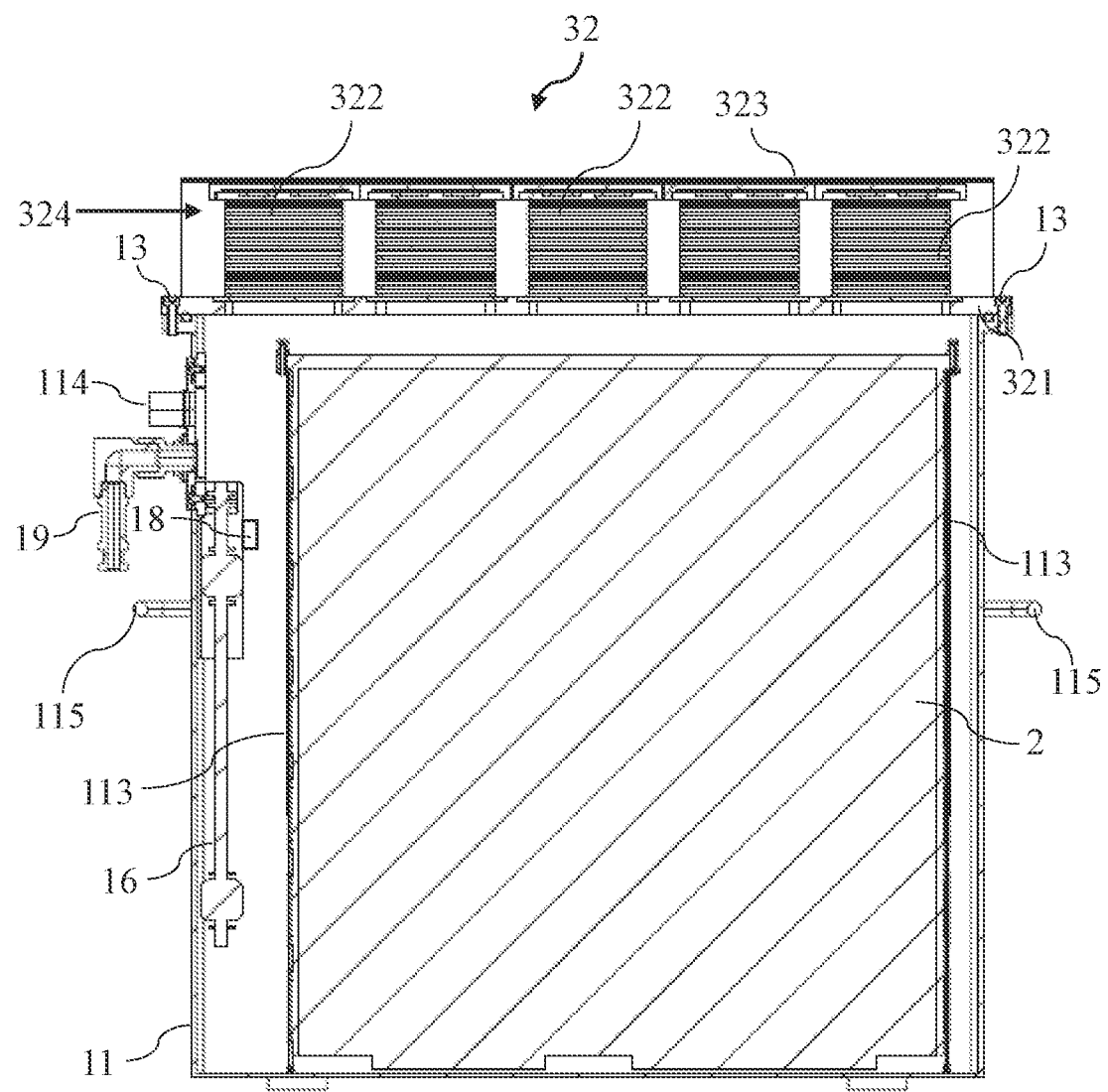
FIG. 12 is a schematic cross-sectional view of the immersed cabinet taken along line E-E of FIG. 11.
Figure 13:
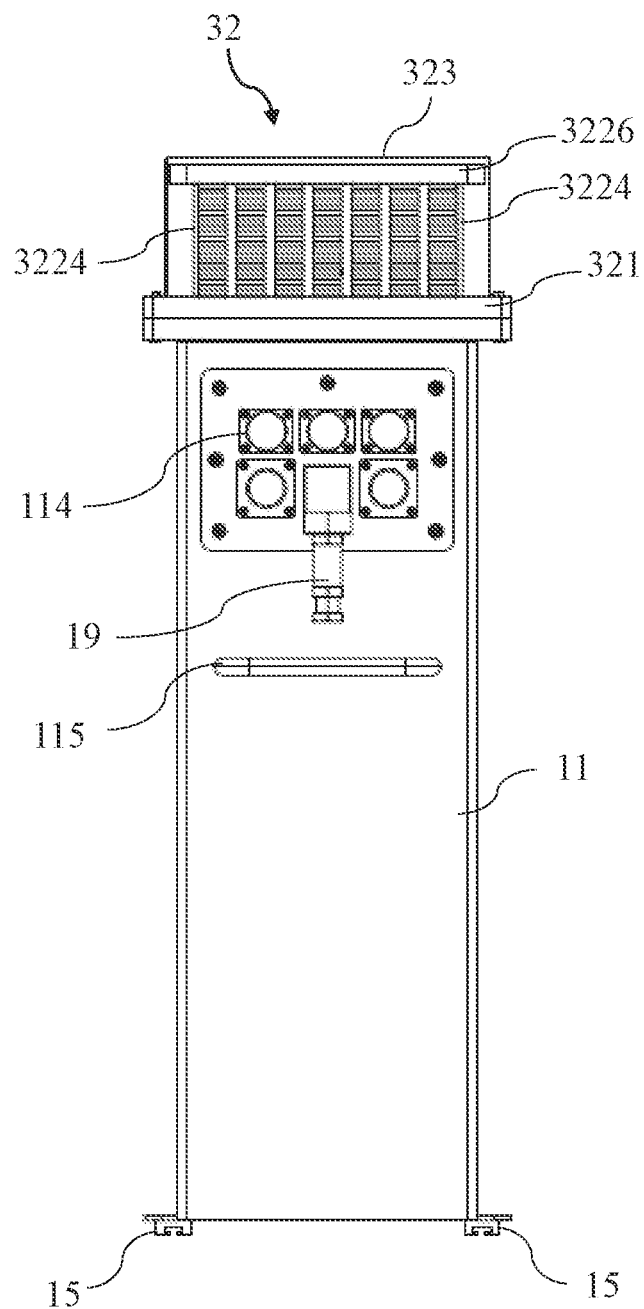
FIG. 13 is a schematic view of the immersed cabinet of FIG. 11.
Figure 14:
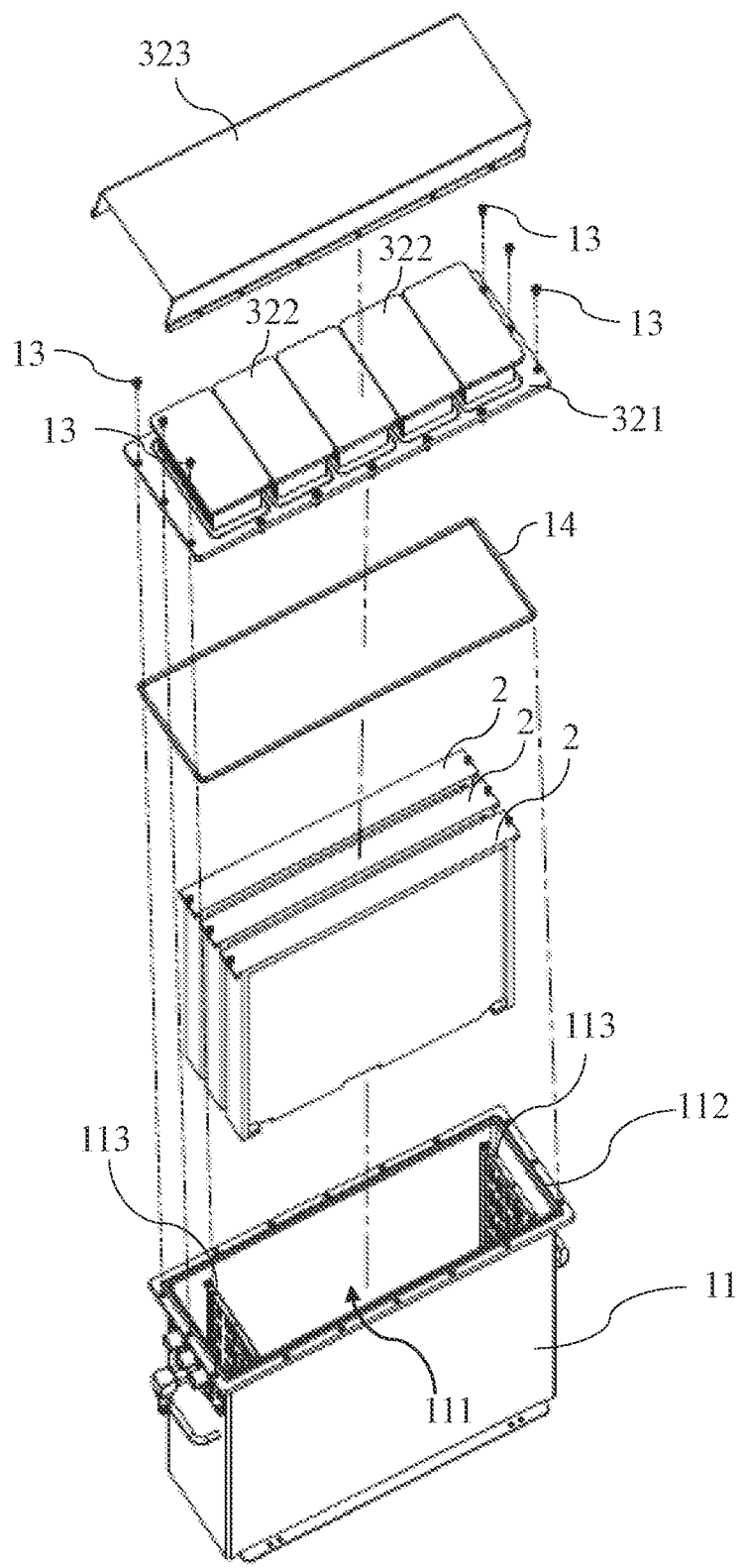
FIG. 14 is an exploded view of an embodiment of the immersed cabinet of FIG. 11.

Please refer to FIG. 11 to FIG. 14, wherein FIG. 11 is a schematic perspective view of an immersed cabinet according to another embodiment of the present disclosure, FIG. 12 is a schematic cross-sectional view of the immersed cabinet taken along line E-E of FIG. 11, FIG. 13 is a schematic view of the immersed cabinet of FIG. 11, and FIG. 14 is an exploded view of an embodiment of the immersed cabinet of FIG. 11. As shown in FIG. 11 to FIG. 14, the difference between the immersed cabinet 3 and the immersed cabinet 1 is that the heat sink assembly 32 is different from the heat sink assembly 12, and the heat sink assembly 32 may greatly reduce the manufacturing difficulty under the premise of satisfying the circulation of the cooling liquid in the cabinet body 11. The heat sink assembly 32 may be integrally welded and formed by brazing at one time. The detailed description of the heat sink assembly 32 is as follows.

Figure 15:
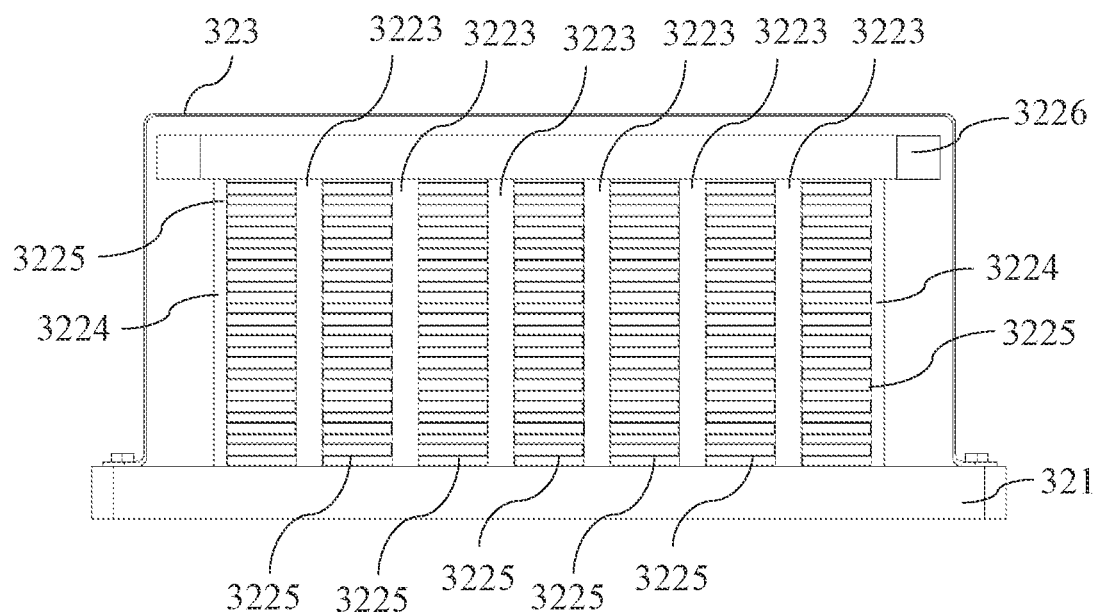
FIG. 15 is a schematic perspective view of the heat sink assembly of FIG. 11.
Figure 16:
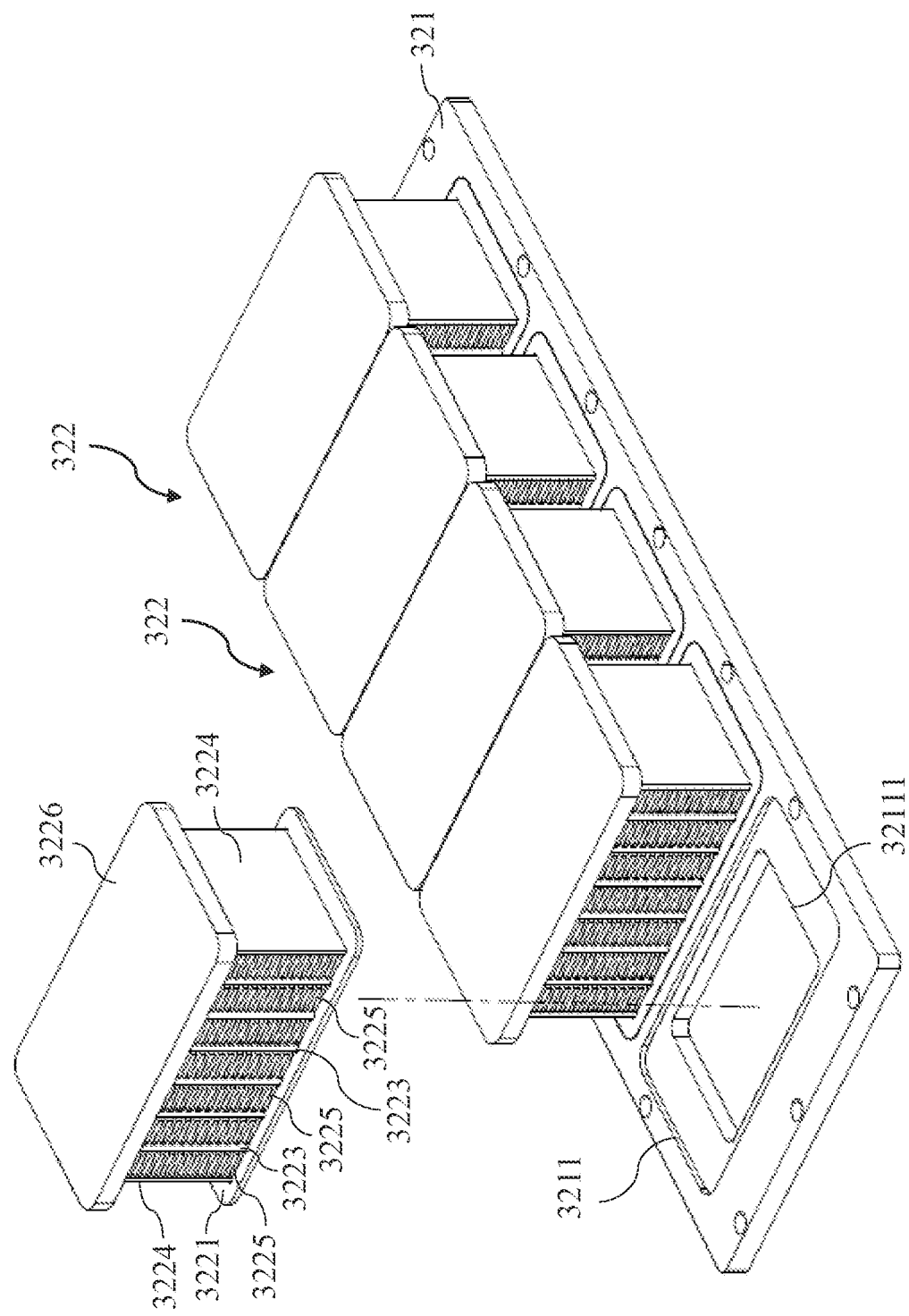
FIG. 16 is a partial exploded schematic diagram of the cooling assembly of FIG. 15.
Figure 17:
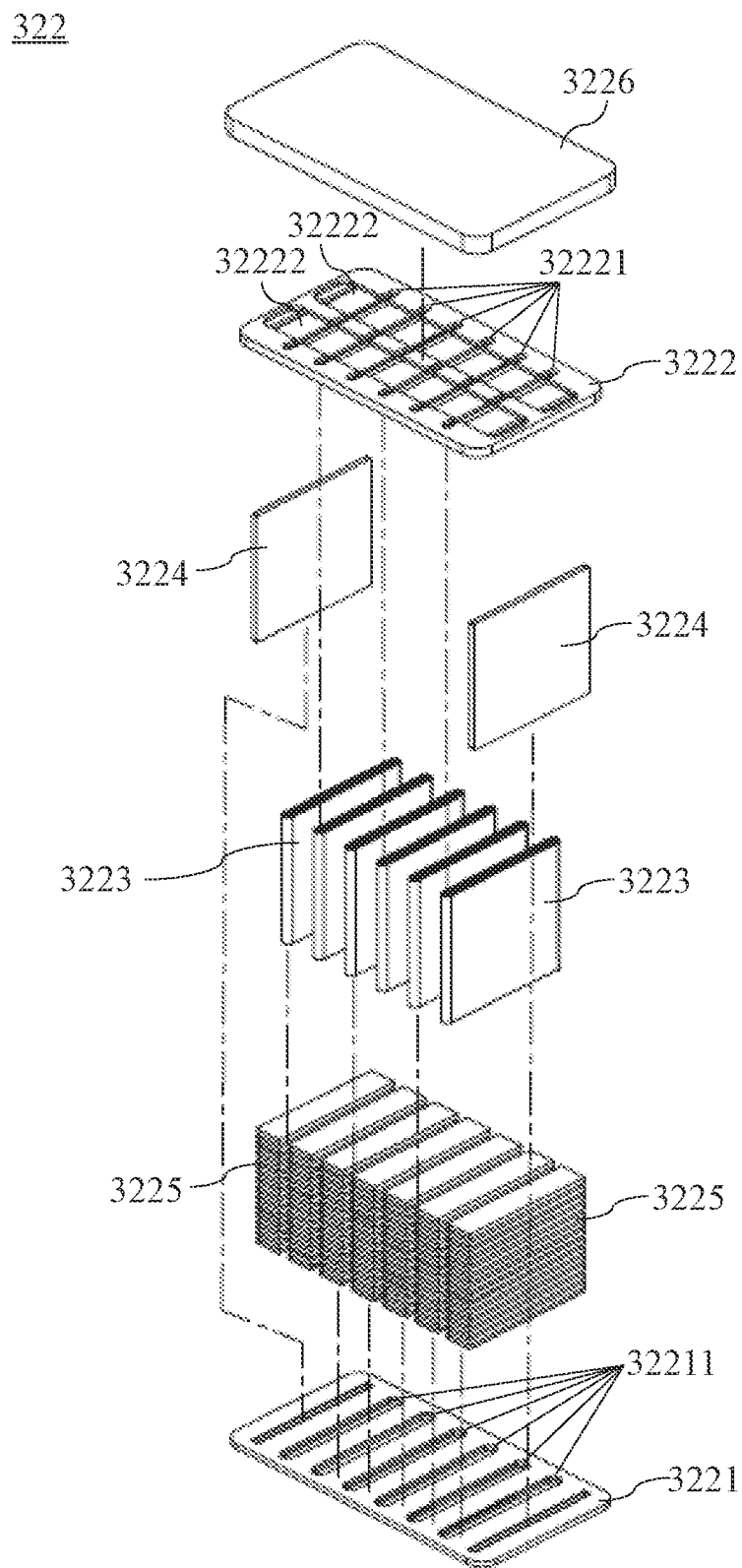
FIG. 17 is an exploded view of an embodiment of the heat dissipation module of FIG. 16.

Please refer to FIG. 15 to FIG. 17, wherein FIG. 15 is a schematic perspective view of the heat sink assembly of FIG. 11, FIG. 16 is a partial exploded schematic diagram of the cooling assembly of FIG. 15, and FIG. 17 is an exploded view of an embodiment of the heat dissipation module of FIG. 16. As shown in FIG. 15 to FIG. 17, the heat sink assembly 32 comprises a second substrate 321 and a plurality of heat dissipation modules 322, the second substrate 321 is fastened to the cabinet body 11 and is provided with a plurality of positioning grooves 3211, and a groove bottom of each positioning groove 3211 is provided with a heat dissipation opening 32111. The plurality of heat dissipation modules 322 are positioned in the plurality of positioning grooves 3211 corresponding thereto, and each heat dissipation module 322 comprises a first main plate 3221, a second main plate 3222, a plurality of harmonica-shaped tubes 3223, two protective plates 3224, a plurality of folded heat dissipating fins 3225 and an upper cover 3226. The first main plate 3221 is positioned in the positioning groove 3211 corresponding thereto, and is provided with a plurality of first through holes 32211. The second main plate 3222 is provided with a plurality of second through holes 32221 and a condensation groove 32222, and the condensation groove 32222 communicates with the plurality of second through holes 32221. The plurality of harmonica-shaped tubes 3223 are disposed between the first main plate 3221 and the second main plate 3222, and openings at both ends of each of the plurality of harmonica-shaped tubes 3223 are respectively connected to one first through hole 32211 of the first main plate 3221 and one second through hole 32221 of the second main plate 3222 respectively. The two protective plates 3224 are disposed between the first main plate 3221 and the second main plate 3222, and are parallel to the plurality of harmonica-shaped tubes 3223, and the plurality of harmonica-shaped tubes 3223 are located between the two protective plates 3224. The plurality of folded heat dissipating fins 3225 are connected and fastened between two adjacent harmonica-shaped tubes 3223, and between the two protective plates 3224 and their adjacent harmonica-shaped tubes 3223. The upper cover 3226 is disposed on the second main plate 3222 to cover a notch of the condensation groove 32222.

Specifically, the second substrate 321 is used to connect and fasten with the cabinet body 11, and through the setting of the heat dissipation openings 32111, the plurality of heat dissipation modules 322 disposed on the second substrate 321 can exchange heat with the vaporized cooling liquid. The vaporized cooling liquid diffuses into the harmonica-shaped tubes 3223 and the condensation groove 32222 through the first through holes 32211 and the second through holes 32221, and exchanges heat with the harmonica-shaped tubes 3223 during the diffusion process to liquefy and return to the cabinet body 11. The harmonica-shaped tubes 3223 transfer heat to the folded heat dissipating fins 3225 connected thereto to release the heat to the atmosphere. The upper cover 3226 is used to prevent the vaporized cooling liquid from escaping.

Figure 18:
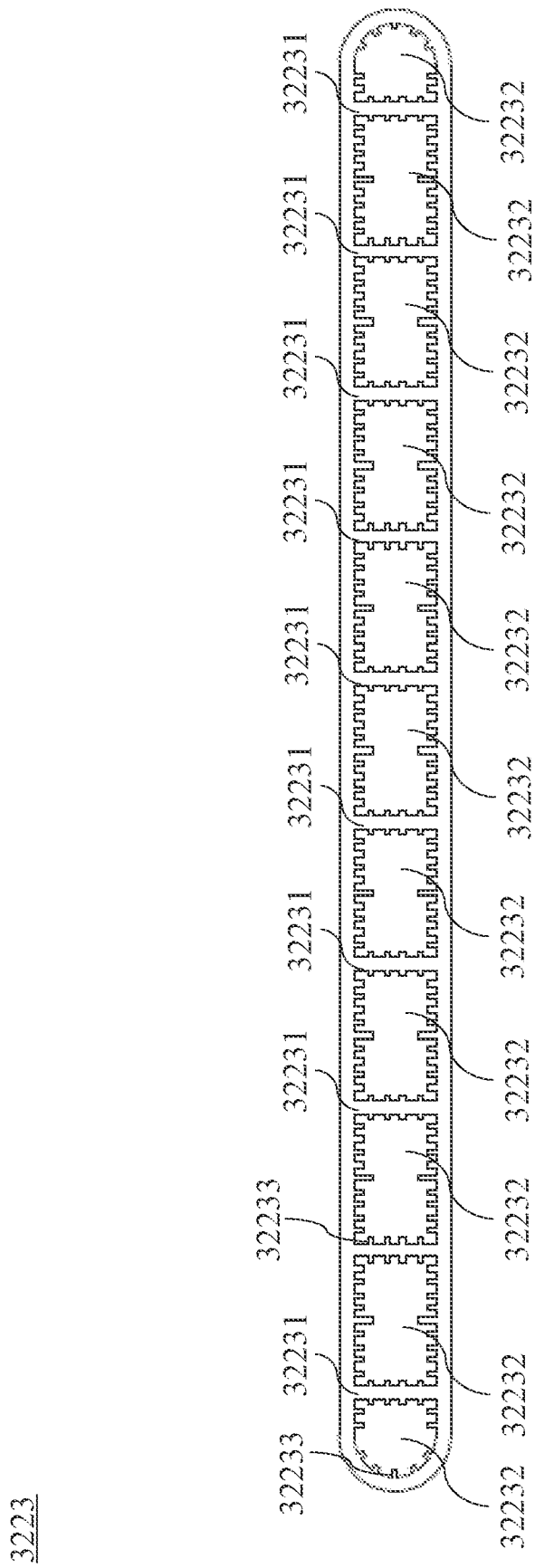
FIG. 18 is a schematic structural view of an embodiment of the harmonica-shaped tube of FIG. 17.

In one embodiment, each harmonica-shaped tube 3223 may be in the shape of a flat tube, each of the plurality of harmonica-shaped tubes 3223 is provided with a plurality of partition plates 32231 at intervals inside to form a plurality of flow channels 32232, and a plurality of convex teeth 32233 are provided on a tube wall of each of the plurality of harmonica-shaped tubes 3223 as shown in FIG. 18, which is a schematic structural view of an embodiment of the harmonica-shaped tube of FIG. 17. The plurality of convex teeth 32233 can increase the contact area between the harmonica-shaped tube 3223 and the vaporized cooling liquid, which can effectively improve the heat dissipation amplitude and facilitate the use of heat dissipation.

Please refer to FIG. 14 to FIG. 15, the heat sink assembly 32 may further comprise a third protection cover 323. The third protective cover 323 covers around the two protective plates 3224 and the upper cover 3226 of each of the plurality of heat dissipation modules 322, and is fixedly connected to the second substrate 321 to form a heat dissipation air channel 324 with two open ends. Specifically, the third protective cover 323 may be an inverted U-shaped protective cover, and the two ends of the inverted U-shaped protective cover are fixedly connected to the second substrate 321 to form the heat dissipation air channel 324 arranged along the first direction D1. The third protective cover 323 can not only protect the plurality of heat dissipation modules 322, but also play a role of air guide, which is beneficial to speed up heat dissipation and avoids the operator from being burned.

Figure 19:
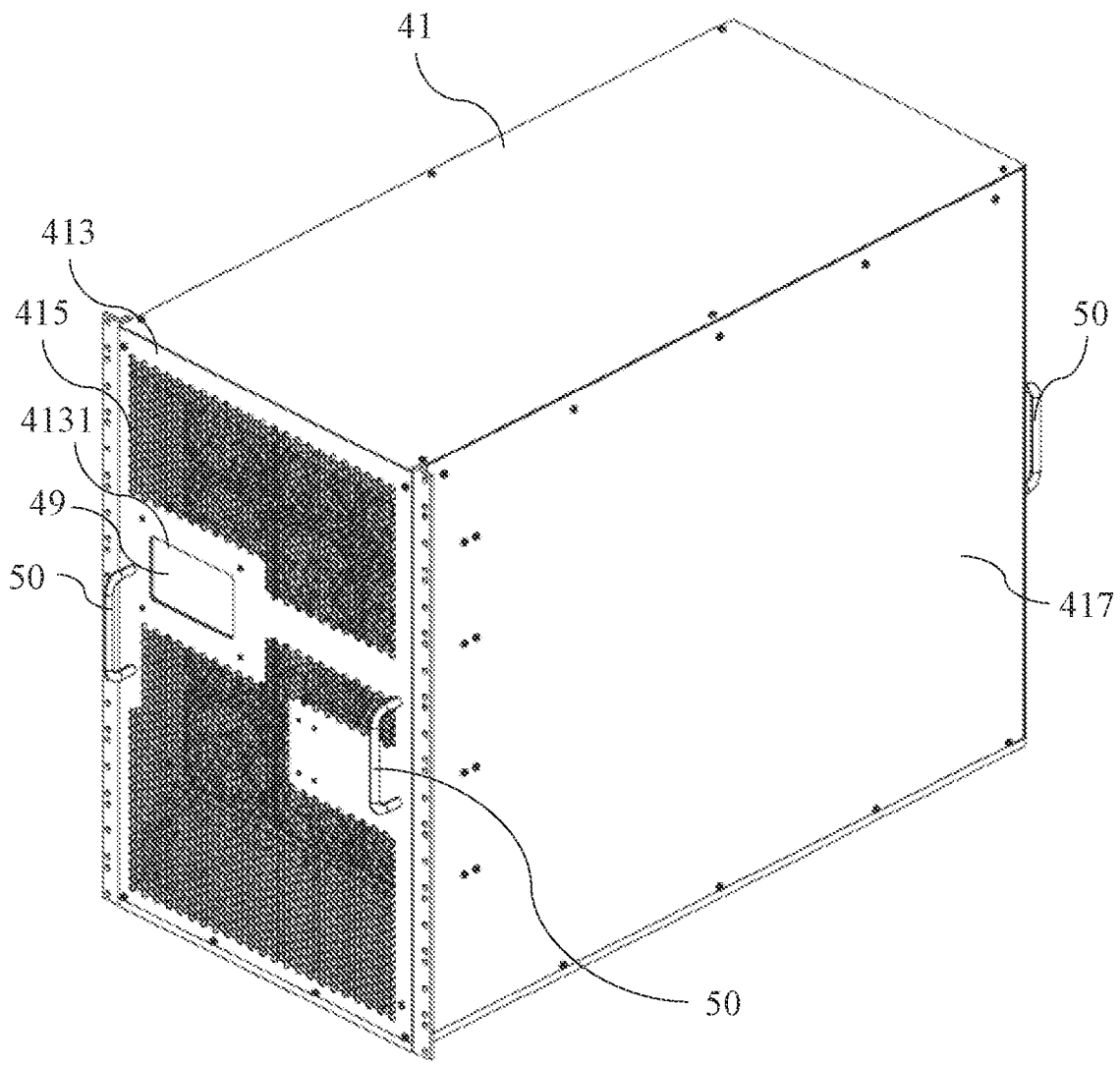
FIG. 19 is a perspective schematic diagram of the heat dissipation system of the immersed cabinet according to the present disclosure from a first viewing angle.
Figure 20:
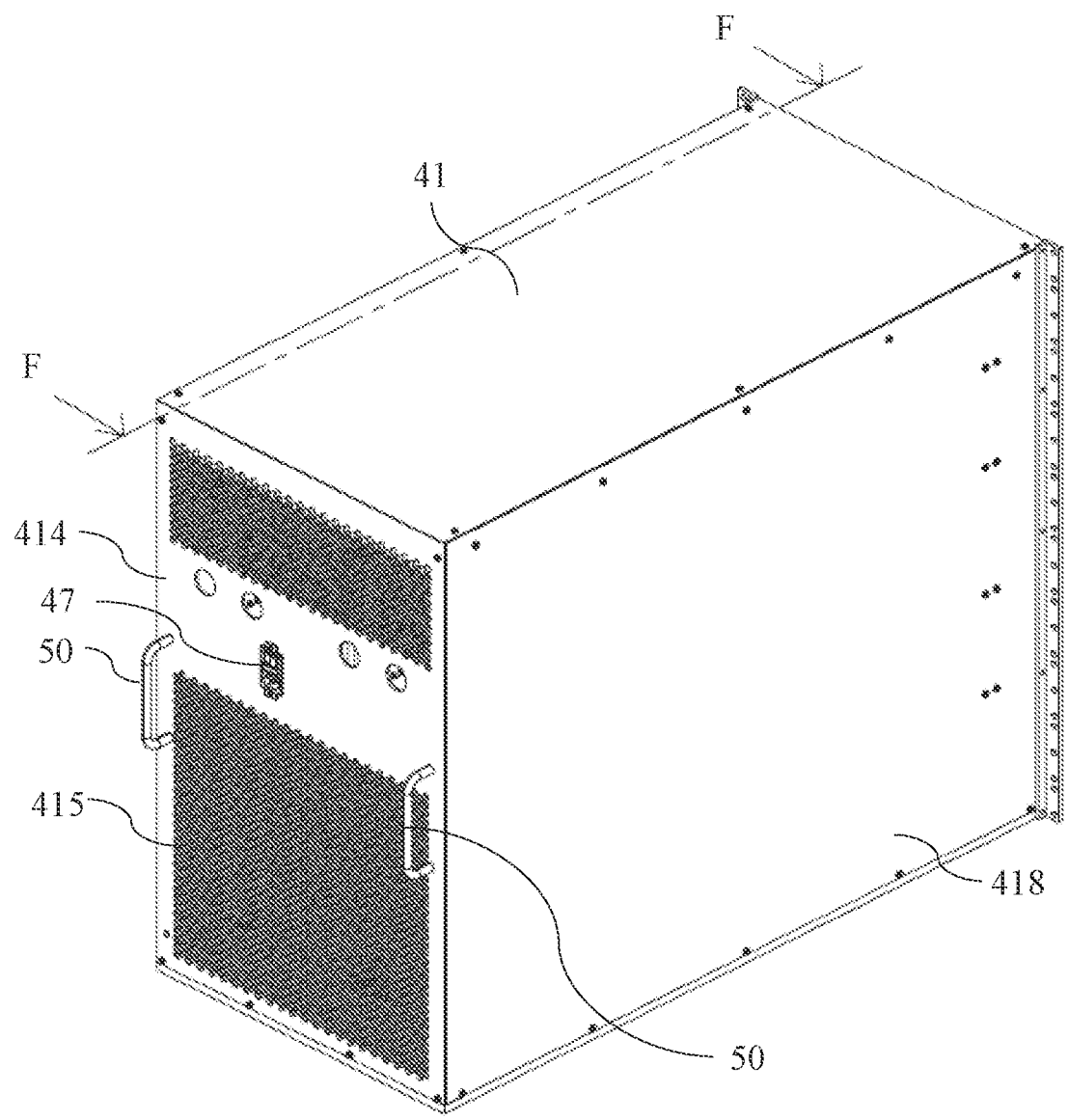
FIG. 20 is a perspective schematic diagram of the heat dissipation system of the immersed cabinet according to the present disclosure from a second viewing angle.
Figure 21:
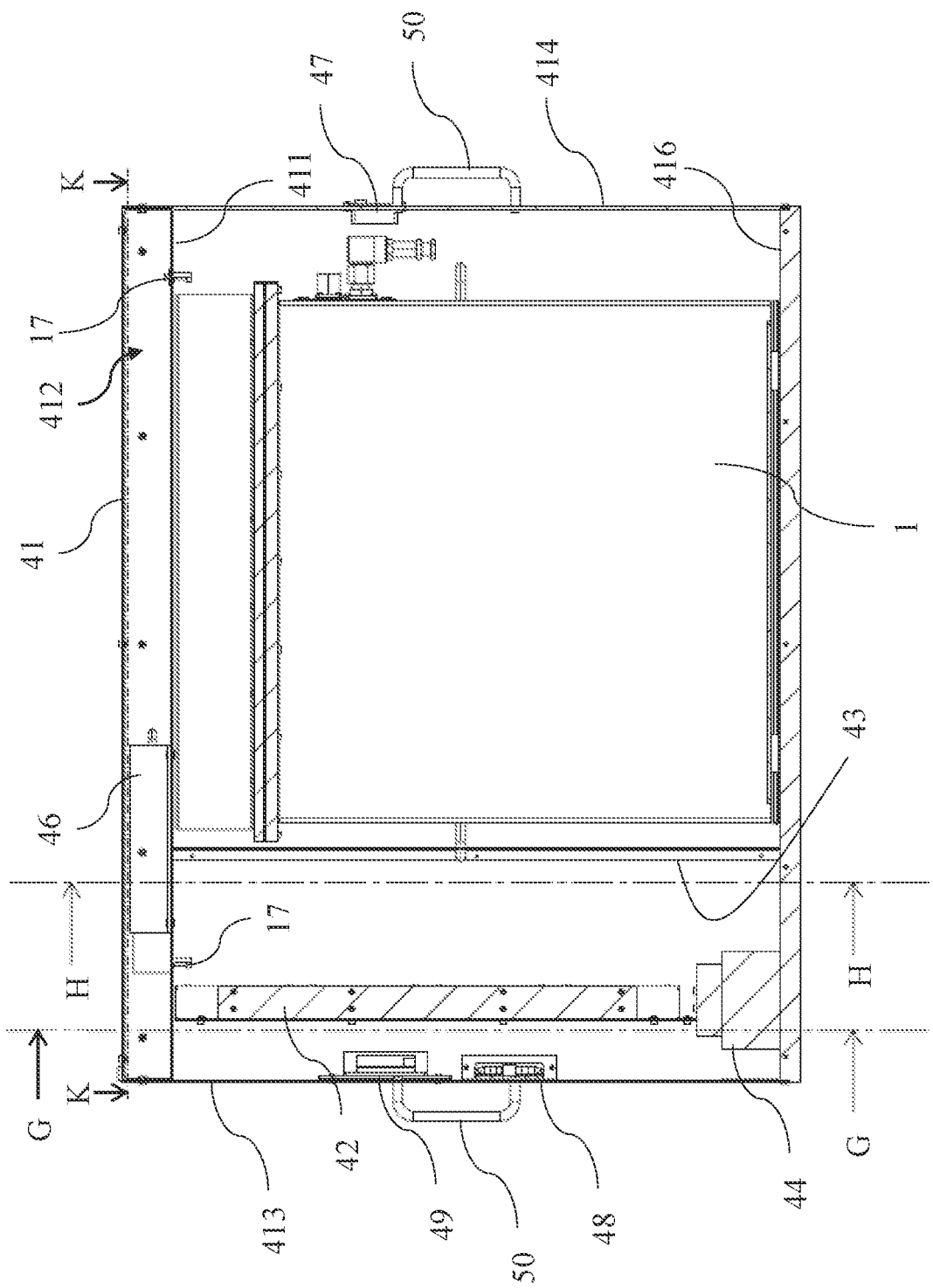
FIG. 21 is a schematic cross-sectional view of the heat dissipation system of the immersed cabinet taken along the line F-F of FIG. 20.
Figure 22:
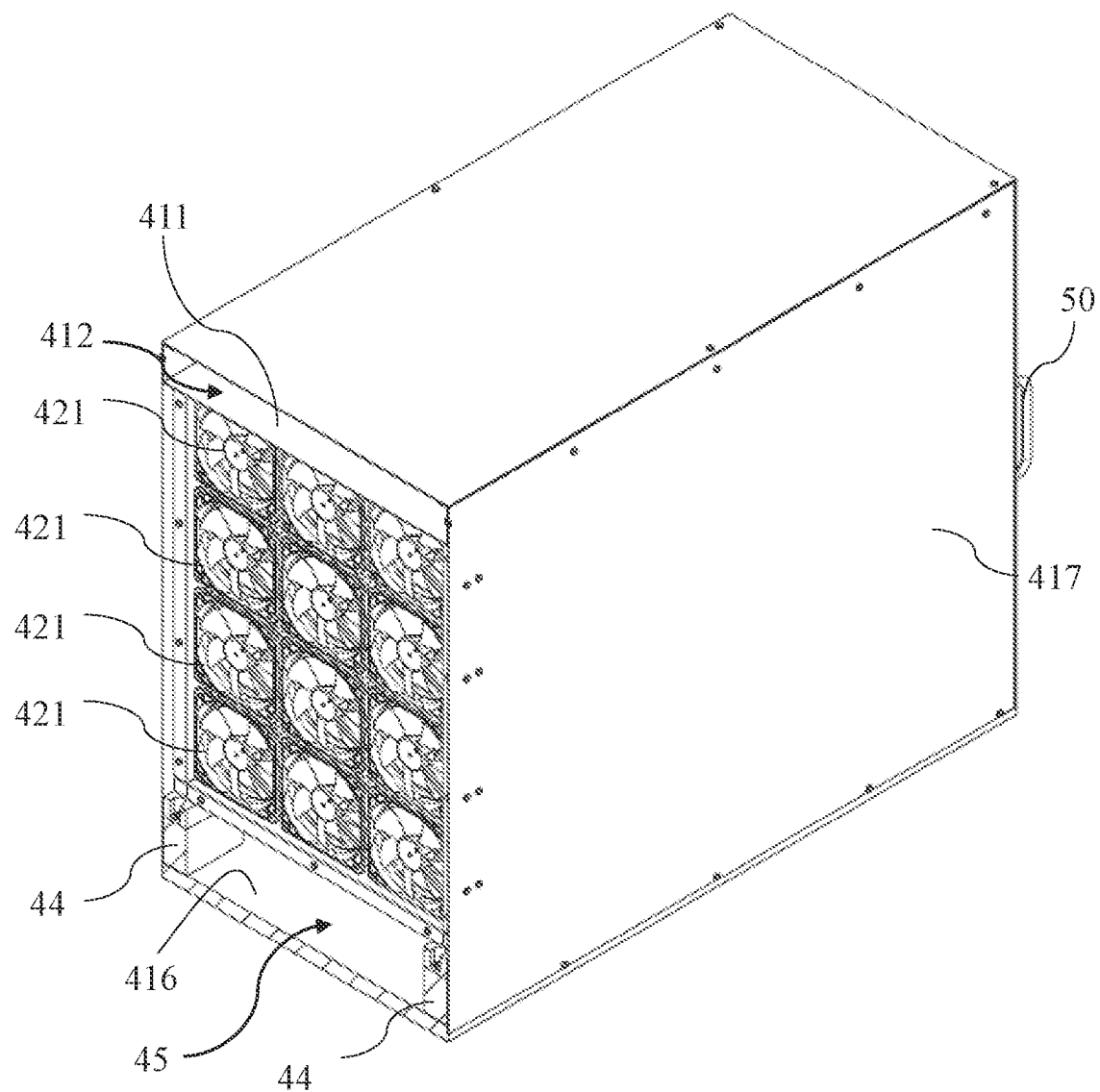
FIG. 22 is a schematic cross-sectional view of the heat dissipation system of the immersed cabinet taken along the line G-G of FIG. 21.

Please refer to FIG. 19 to FIG. 22, wherein FIG. 19 is a perspective schematic diagram of the heat dissipation system of the immersed cabinet according to the present disclosure from a first viewing angle, FIG. 20 is a perspective schematic diagram of the heat dissipation system of the immersed cabinet according to the present disclosure from a second viewing angle, FIG. 21 is a schematic cross-sectional view of the heat dissipation system of the immersed cabinet taken along the line F-F of FIG. 20, and FIG. 22 is a schematic cross-sectional view of the heat dissipation system of the immersed cabinet taken along the line G-G of FIG. 21. As shown in FIG. 19 to FIG. 22, a heat dissipation system 4 of an immersed cabinet comprises a case body 41 and a fan array 42. The case body 41 is provided with a partition plate 411 to form a cable passage 412 on the top of the case body 41. A front side wall 413 and a rear side wall 414 of the case body 41 are provided with a plurality of ventilation holes 415, the case body 41 accommodates a plurality of the immersed cabinets 1 disposed side by side, and a heat dissipation direction of the heat sink assembly 12 is parallel to a ventilation direction of the case body 41. That is, the air flows into the case body 41 from the multiple ventilation holes 415 of the front side wall 413, and flows out of the case body 41 from the multiple ventilation holes 415 of the rear side wall 414. The fan array 42 is disposed between the partition plate 411 and a bottom surface 416 of the case body 41, and between the front side wall 413 and the plurality of the immersed cabinets 1 disposed side by side. The fan array 42 blows air toward the plurality of the immersed cabinets 1 disposed side by side. The fan array 42 comprises a plurality of fans 421. The fan array 42 is used to accelerate the convection of the air in the case body 41, and accelerate the heat dissipation of the heat sink assembly 12 of the immersed cabinets 1, so that the heat dissipation performance is effectively improved. The number of immersed cabinets 1 accommodated in the case body 41 may be but not limited to two, and can be adjusted according to actual needs. The front side wall 413 and the rear side wall 414 may be fixedly connected to other walls of the case body 41 by means of screw locking for easy disassembly and maintenance of the immersed cabinets 1 and the heat dissipation system 4. For the sake of simplicity, drawing of all the cables in the heat dissipation system 4 is omitted.

Figure 23:
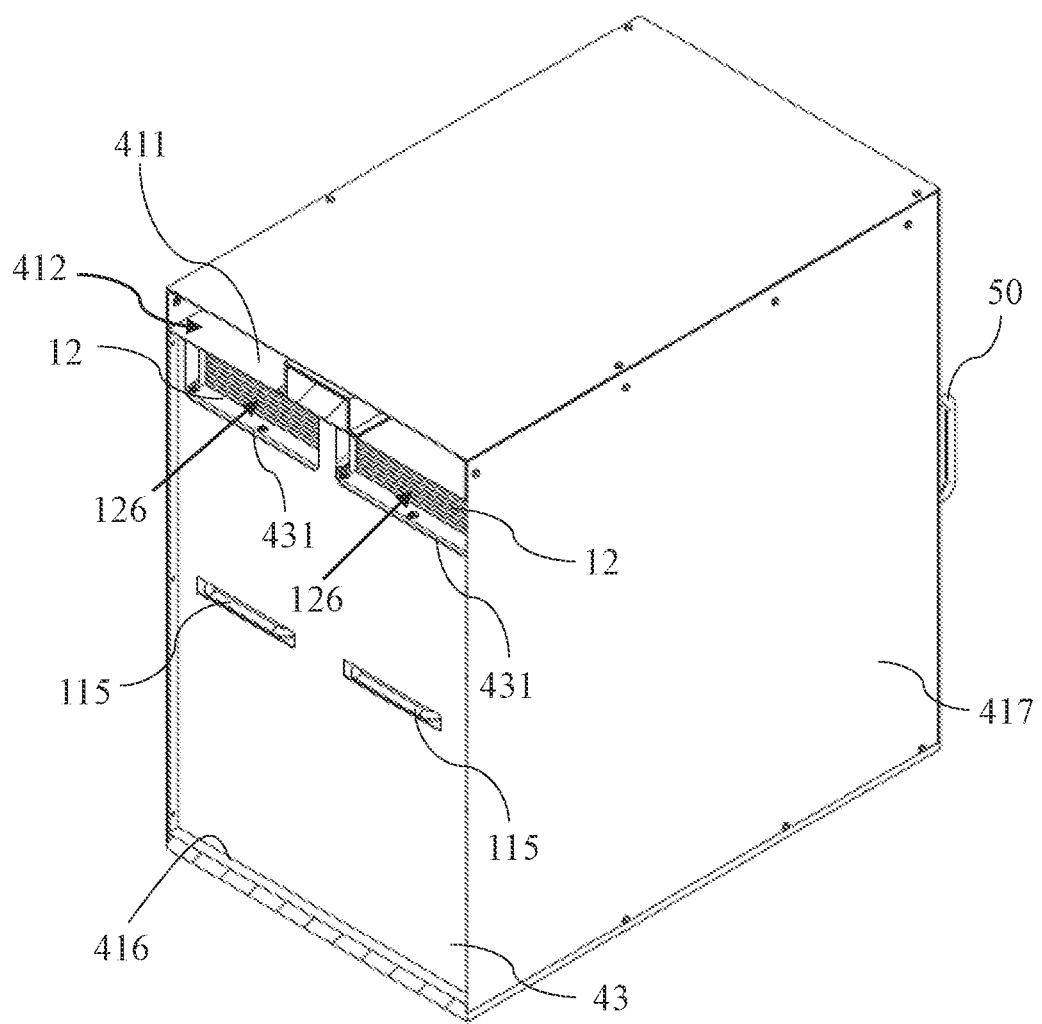
FIG. 23 is a schematic cross-sectional view of the heat dissipation system of the immersed cabinet taken along the line H-H of FIG. 21.

Please refer to FIG. 21 and FIG. 23, wherein FIG. 23 is a schematic cross-sectional view of the heat dissipation system of the immersed cabinet taken along the line H-H of FIG. 21. As shown in FIG. 21 and FIG. 23, the heat dissipation system 4 may further comprise a windshield 43, which is disposed between the partition plate 411 and the bottom surface 416 of the case body 41, and is located between the fan array 42 and the plurality of the immersed cabinet 1 disposed side by side. The windshield 43 is provided with a plurality of vents 431 corresponding to the heat sink assemblies 12 of the plurality of the immersed cabinets 1. The setting of the plurality of vents 431 of the windshield 43 helps to converge the wind blown by the fan array 42 to the plurality of heat sink assemblies 12 of the plurality of the immersed cabinets 1to accelerate heat dissipation and effectively improve the heat dissipation performance.

Please refer to FIG. 22, the heat dissipation system 4 may further comprise two supporting bases 44 disposed on the bottom surface 416 of the case body 41 at intervals. The fan array 42 is disposed between the partition plate 411 and the two supporting bases 44 to form an air outlet duct 45 between the fan array 42 and the bottom surface 416 of the case body 41. The air outlet duct 45 is conducive to speeding up the air volume circulation and effectively improving the heat dissipation performance. The fan array 42 is in contact with the partition plate 411, the left side wall 417 and the right side wall 418 of the case body 41 for fastening, so as to avoid air leakage.

Figure 24:
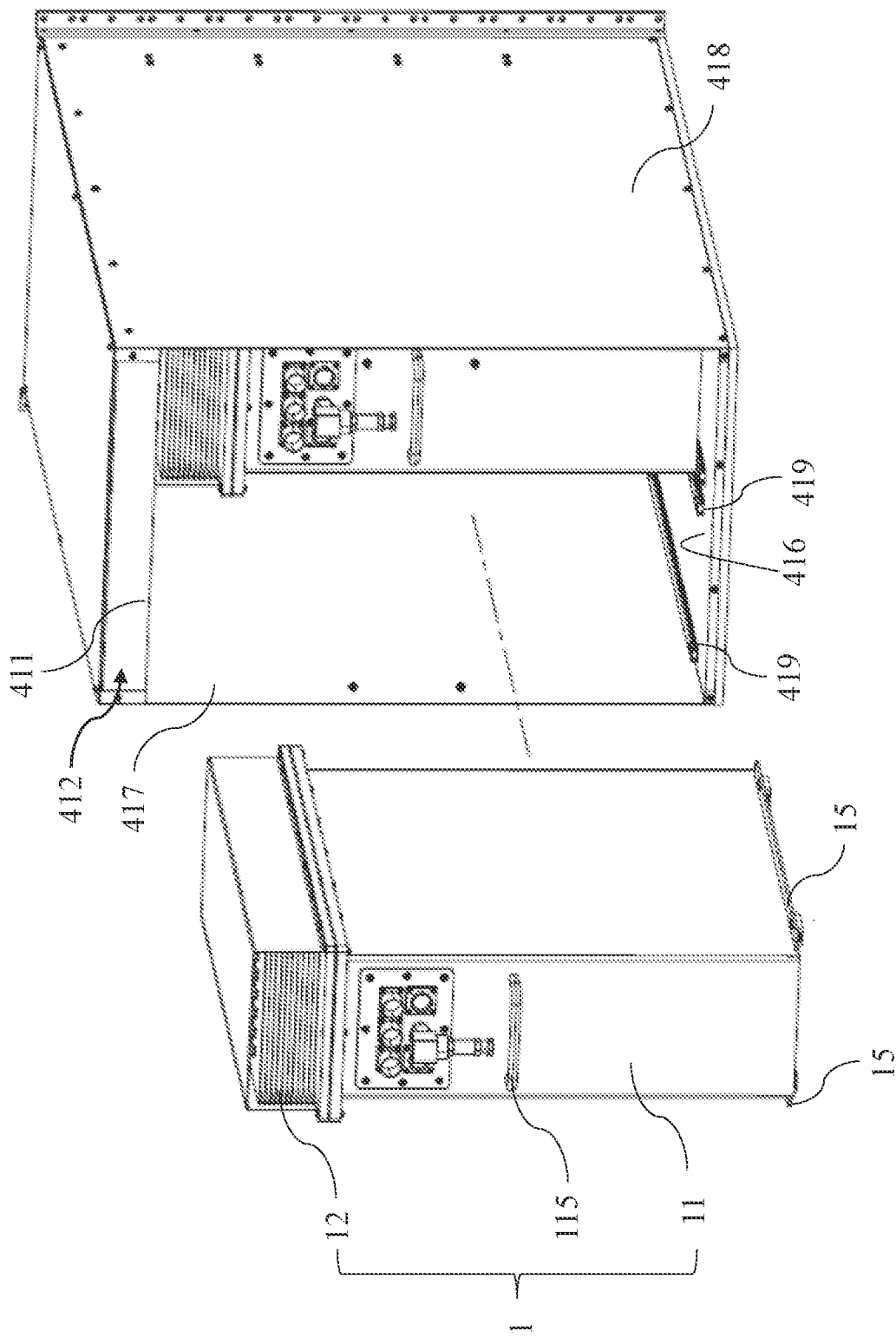
FIG. 24 is a schematic diagram of an embodiment of the immersed cabinet of the present disclosure placed in a case body.

Please refer to FIG. 24, which is a schematic diagram of an embodiment of the immersed cabinet of the present disclosure placed in a case body. As shown in FIG. 24, opposite ends of an outer bottom of the cabinet body 11 of the immersed cabinet 1 are provided with linear slide rails 15, and the bottom surface 416 of the cabinet body 41 is provided with a plurality of slide grooves 419 that are matched with the linear slide rails 15, so that the plurality of the immersed cabinets 1 are slidably installed inside the case body 41. Through the arrangement of the linear slide rail 15 and the slide grooves 419, the immersed cabinet 1 may slide freely inside the case body 41, which is convenient for later maintenance. In addition, a handle 115 may be provided on the outside of the cabinet body 11 of the immersed cabinet 1 to facilitate moving the immersed cabinet 1, and a plurality of handles 50 may further be provided on the outside of the case body 41 for easy moving.

Figure 25:
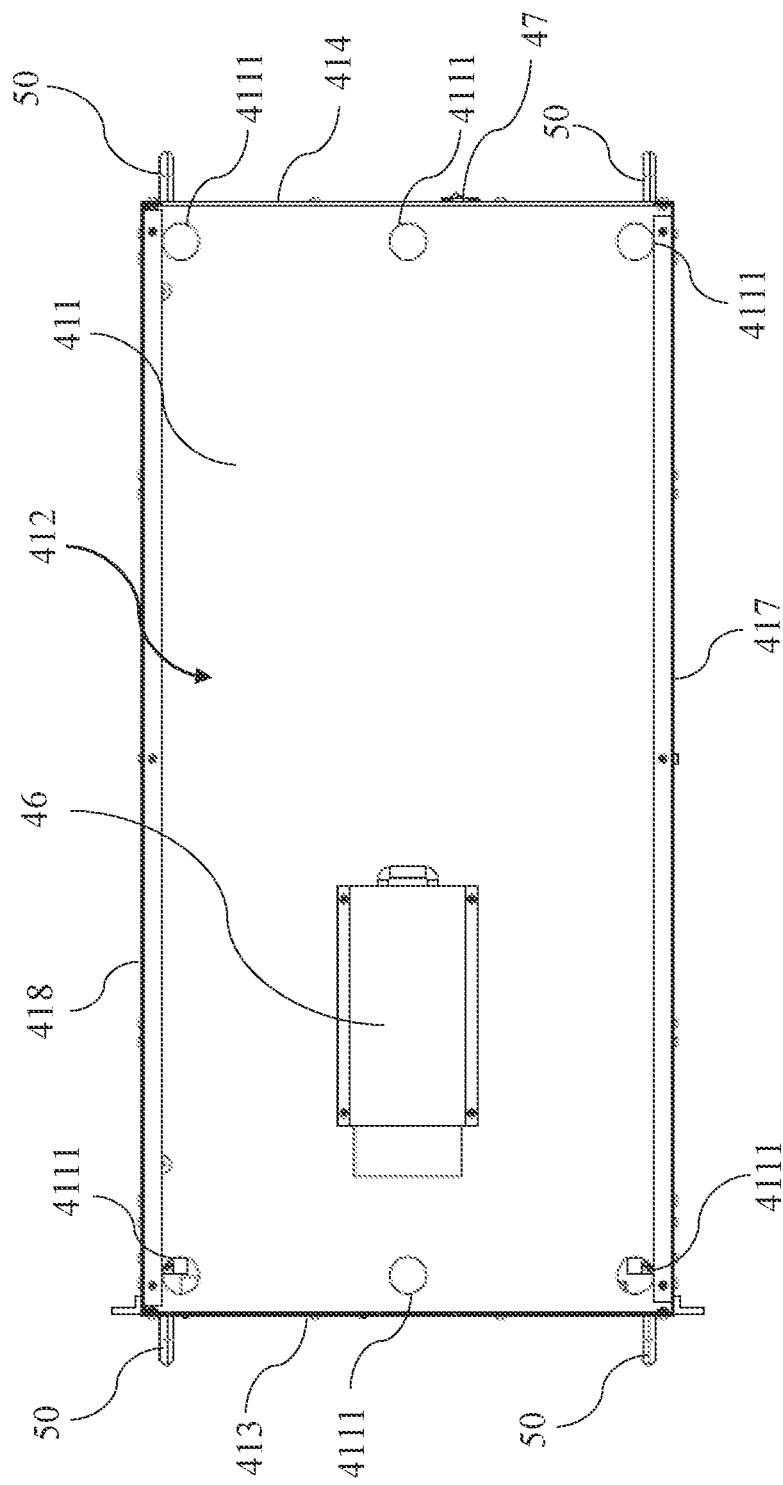
FIG. 25 is a schematic cross-sectional view of the heat dissipation system of the immersed cabinet taken along line K-K of FIG. 21.

Please refer to FIG. 20, FIG. 21 and FIG. 25, wherein FIG. 25 is a schematic cross-sectional view of the heat dissipation system of the immersed cabinet taken along line K-K of FIG. 21. As shown in FIG. 20, FIG. 21 and FIG. 25, the heat dissipation system 4 may further comprise a power module 46 and a power switch 47, and the partition plate 411 is provided with a plurality of wiring holes 4111. The power module 46 is disposed in the cable passage 412, and is connected to the fan array 42 and the power switch 47 through cables (not drawn) passing through the plurality of wiring holes 4111. The power switch 47 is disposed on an outer side of the rear side wall 414 for the operator to control whether to start the power module 46, thereby supplying power to the fan array 42. In addition, the power module 46 may further supply power to other components, such as the temperature sensor 17, the control board 48 and the display screen 49 described below.

Please refer to FIG. 2 and FIG. 21, a liquid level sensor 16, a temperature sensor 17 and a pressure sensor 18 are disposed in the cabinet body 11 of the immersed cabinet 1, the heat dissipation system 4 may further comprise a control board 48 disposed on an inner side of the front side wall 413, and the liquid level sensor 16, the temperature sensor 17 and the pressure sensor 18 are connected to the control board 48 to monitor a liquid level of the cooling liquid in the cabinet body 11 of the immersed cabinet 1 and a temperature and a pressure value inside the immersed cabinet 1 in real time. The temperature sensor 17 may be disposed on the bottom of the cabinet body 11, and the second protective cover 125 of the heat sink assembly 12 may further be provided with another temperature sensor 17. The partition plate 411 may further be provided with a temperature sensor 17 connected to the control board 48 to monitor the temperature inside the case body 41 in real time. In addition, the control board 48 may be electrically connected to the fan array 42 to adjust the rotation speed of the fan array 42 based on the temperature sensed by the temperature sensor 17. For clarity purposes, drawing of all cables for electrical connections is omitted.

In one embodiment, the heat dissipation system 4 may further comprise a display screen 49 connected to the control board 48, the display screen 49 is disposed on an inner side of the front side wall 413 and exposed through an opening 4131 of the front side wall 413, so as to display the liquid level of the cooling liquid in the cabinet body 11 of the immersed cabinet 1 and the temperature and the pressure value inside the immersed cabinet 1 in real time. Thus, the operator can confirm the current liquid level of the cooling liquid in the cabinet body 11 of the immersed cabinet 1 and the current temperature and the current pressure value inside the immersed cabinet 1.

In one embodiment, a pressure relief valve 19 connecting with the inside of the cabinet body 11 is provided on the outside of the immersed cabinet 1. When the internal pressure value of the immersed cabinet 1 is too high, the operator can release the internal pressure of the immersed cabinet 1 through the pressure relief valve 19.

In summary, in the present disclosure, the immersed cabinet adopts the design of the heat sink assembly sealedly connected with the cabinet body, instead of the cooling distribution unit that needs to be set outside the cooling container for the existing immersed cabinet using single-phase immersion liquid cooling heat dissipation technology, which effectively simplifies the heat dissipation structure design of the immersed cabinet, and reduces loss. In addition, through the setting of the fan array, the heat dissipation system of the immersed cabinet accelerates the air convection inside the case body, accelerates the heat dissipation of the heat sink assembly of the immersed cabinet, and improves the heat dissipation performance.

While the present disclosure is disclosed in the foregoing embodiments, it should be noted that these descriptions are not intended to limit the present disclosure. On the contrary, the present disclosure covers modifications and equivalent arrangements obvious to those skilled in the art. Therefore, the scope of the claims must be interpreted in the broadest manner to comprise all obvious modifications and equivalent arrangements.

What is claimed is:
1. An immersed cabinet, comprising:
a cabinet body provided with an opening, the cabinet body accommodating a plurality of devices to be cooled, cooling liquid being put in the cabinet body and used for immersing the plurality of devices to be cooled, the cooling liquid absorbing heat generated by the plurality of devices to be cooled and then being vaporized; and
a heat sink assembly being in sealed connection with the cabinet body, and configured to seal an opening of the cabinet body, and exchange heat with the vaporized cooling liquid, so that the vaporized cooling liquid condenses and flows back to the cabinet body for circulation, and the heat sink assembly dissipates the heat into the atmosphere, wherein the heat sink assembly comprises:

a first substrate fastened to the cabinet body and provided with a plurality of through holes;

a plurality of heat pipes tightly connected to the first substrate through the plurality of through holes, each of the plurality of heat pipes being divided into a first section facing the cabinet body and a second section away from the cabinet body by being tightly connected to the first substrate; and a plurality of cooling fins, a part of the plurality of cooling fins being tightly connected to the first sections of the plurality of heat pipes by means of interference fit, and being configured to exchange heat with the vaporized cooling liquid, and conducting the heat to the plurality of heat pipes; the other part of the plurality of cooling fins being tightly connected to the second sections of the plurality of heat pipes by means of interference fit, and being configured to dissipate heat from the plurality of heat pipes to the atmosphere.

2. The immersed cabinet according to claim 1, wherein each of the plurality of cooling fins is provided with a plurality of openings tightly connected to the plurality of heat pipes, and a hole wall extending along an extending direction of the plurality of heat pipes around each of the plurality of openings is provided with a guide groove.

3. The immersed cabinet according to claim 1, wherein an edge of each of the plurality of through holes is provided with a reverse taper angle.

4. The immersed cabinet according to claim 1, wherein each of the plurality of cooling fins is provided with a plurality of openings tightly connected to the plurality of heat pipes, and a hole wall extending along an extending direction of the plurality of heat pipes around each of the plurality of openings is provided with a guide groove.

5. The immersed cabinet according to claim 1, wherein an edge of each of the plurality of through holes is provided with a reverse taper angle.

6. The immersed cabinet according to claim 1, wherein the heat sink assembly further comprises a first protective cover and a second protective cover; the first protective cover covers the plurality of cooling fins tightly connected to the second sections of the plurality of heat pipes, and is fixedly connected to the first substrate to form a heat dissipation air channel with two open ends; and the second protective cover covers the plurality of cooling fins tightly connected to the first sections of the plurality of heat pipes, and is fixedly connected to the first substrate, and is provided with a plurality of perforations.

7. An immersed cabinet, comprising:

a cabinet body provided with an opening, the cabinet body accommodating a plurality of devices to be cooled, cooling liquid being put in the cabinet body and used for immersing the plurality of devices to be cooled, the cooling liquid absorbing heat generated by the plurality of devices to be cooled and then being vaporized; and a heat sink assembly being in sealed connection with the cabinet body, and configured to seal an opening of the cabinet body, and exchange heat with the vaporized cooling liquid, so that the vaporized cooling liquid condenses and flows back to the cabinet body for circulation, and the heat sink assembly dissipates the heat into the atmosphere, wherein the heat sink assembly comprises: a second substrate fastened to the cabinet body and provided with a plurality of positioning grooves, a groove bottom of each of the plurality of positioning grooves being provided with a heat dissipation opening; and a plurality of heat dissipation modules positioned in the plurality of positioning grooves corresponding thereto, each of the plurality of heat dissipation modules comprising: a first main plate positioned in a positioning groove corresponding thereto, and provided with a plurality of first through holes; a second main plate provided with a plurality of second through holes and a condensation groove communicating with the plurality of second through holes; a plurality of harmonica-shaped tubes disposed between the first main plate and the second main plate, openings at both ends of each of the plurality of harmonica-shaped tubes are respectively connected to one first through hole of the first main plate and one second through hole of the second main plate respectively; two protective plates disposed between the first main plate and the second main plate, parallel to the plurality of harmonica-shaped tube, the plurality of harmonica-shaped tubes being located between the two protective plates; a plurality of folded heat dissipating fins connected and fastened between two adjacent harmonica-shaped tubes, and between the two protective plates and their adjacent harmonica-shaped tubes; and an upper cover disposed on the second main plate to cover a notch of the condensation groove.

8. The immersed cabinet according to claim 7, wherein each of the plurality of harmonica-shaped tubes is in the shape of a flat tube, each of the plurality of harmonica-shaped tubes is provided with a plurality of partition plates at intervals inside to form a plurality of flow channels, and a plurality of convex teeth are provided on a tube wall of each of the plurality of harmonica-shaped tubes.

9. The immersed cabinet according to claim 7, wherein the heat sink assembly further comprises a third protective cover; and the third protective cover covers around the two protective plates and the upper cover of each of the plurality of heat dissipation modules, and is fixedly connected to the second substrate to form a heat dissipation air channel with two open ends.

10. The immersed cabinet according to claim 1, wherein mounting brackets are fixedly installed in the cabinet body and are symmetrically distributed, each mounting bracket is provided with a plurality of slideways, and two ends of each device to be cooled are slidably installed in one slideway of the symmetrically distributed mounting brackets.

11. The immersed cabinet according to claim 1, wherein an outer wall of the cabinet body is provided with a plurality of aviation plugs, and the plurality of aviation plugs are configured to connect with cables in the cabinet body to realize transmission of internal and external signals of the immersed cabinet.

12. A heat dissipation system of an immersed cabinet, comprising:

a case body provided with a partition plate to form a cable passage on the top of the case body, a front side wall and a rear side wall of the case body being provided with a plurality of ventilation holes, the case body accommodating a plurality of the immersed cabinets according to claim 1 disposed side by side, a heat dissipation direction of the heat sink assembly of the immersed cabinet being parallel to a ventilation direction of the case body; and a fan array disposed between the partition plate and a bottom surface of the case body, and between the front side wall and the plurality of immersed cabinets disposed side by side, the fan array blowing air toward the plurality of immersed cabinets disposed side by side.

13. The heat dissipation system according to claim 12, further comprising a windshield disposed between the partition plate and the bottom surface of the case body, and between the fan array and the plurality of the immersed cabinet disposed side by side; and the windshield is provided with a plurality of vents corresponding to the heat sink assemblies of the plurality of the immersed cabinets.

14. The heat dissipation system according to claim 12, further comprising two support bases disposed on the bottom surface of the case body at intervals; wherein the fan array is disposed between the partition plate and the two supporting bases to form an air outlet duct between the fan array and the bottom surface of the case body.

15. The heat dissipation system according to claim 12, wherein opposite ends of an outer bottom of the cabinet body of the immersed cabinet are provided with linear slide rails, and the bottom surface of the cabinet body is provided with a plurality of slide grooves matched with the linear slide rails, so that the plurality of the immersed cabinets are slidably installed inside the case body.

16. The heat dissipation system according to claim 12, further comprising a power module and a power switch, wherein the partition plate is provided with a plurality of wiring holes, the power module is disposed in the cable passage and is connected to the fan array and the power switch through cables passing through the plurality of wiring holes, and the power switch is disposed on an outer side of the rear side wall.

17. The heat dissipation system according to claim 12, wherein a liquid level sensor, a temperature sensor and a pressure sensor are disposed in the cabinet body of the immersed cabinet, the heat dissipation system of the immersed cabinet further comprises a control board disposed on an inner side of the front side wall, and the liquid level sensor, the temperature sensor and the pressure sensor are connected to the control board to monitor a liquid level of the cooling liquid in the cabinet body of the immersed cabinet and a temperature and a pressure value inside the immersed cabinet in real time.

18. The heat dissipation system according to claim 17, further comprising a display screen connected to the control board, wherein the display screen is disposed on an inner side of the front side wall and exposed through an opening of the front side wall, so as to display the liquid level of the cooling liquid in the cabinet body of the immersed cabinet and the temperature and the pressure value inside the immersed cabinet in real time.

19. The heat dissipation system according to claim 17, wherein a pressure relief valve connecting with inside of the cabinet body is provided on outside of the immersed cabinet.

* * * * *